(12) United States Patent
Yim et al.

(10) Patent No.: US 12,512,398 B2
(45) Date of Patent: Dec. 30, 2025

(54) SEMICONDUCTOR PACKAGE HAVING SEMICONDUCTOR CHIP POSITIONED IN CAVITY OF COVER WIRING STRUCTURE

(71) Applicant: Samsung Electronics Co., Ltd., Suwon-si (KR)

(72) Inventors: Choongbin Yim, Suwon-si (KR); Sungbum Kim, Suwon-si (KR); Jiyong Park, Suwon-si (KR); Jinwoo Park, Suwon-si (KR); Jongbo Shim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 317 days.

(21) Appl. No.: 18/166,181

(22) Filed: Feb. 8, 2023

(65) Prior Publication Data

US 2023/0361018 A1    Nov. 9, 2023

(30) Foreign Application Priority Data

May 4, 2022  (KR) .......................... 10-2022-0055726

(51) Int. Cl.
*H01L 23/498*  (2006.01)
*H01L 23/31*  (2006.01)
(Continued)

(52) U.S. Cl.
CPC .... *H01L 23/49838* (2013.01); *H01L 23/3128* (2013.01); *H10B 80/00* (2023.02);
(Continued)

(58) Field of Classification Search
CPC .......... H01L 23/49838; H01L 23/3128; H10B 80/00
See application file for complete search history.

(56) References Cited

U.S. PATENT DOCUMENTS 8,411,450 B2    4/2013  Yamazaki et al.
8,649,186 B2    2/2014  You et al.
(Continued)

FOREIGN PATENT DOCUMENTS

KR  10-2007-0015861 A   2/2007
KR     101466450 B1    11/2014
KR  10-2022-0009218 A   1/2022

OTHER PUBLICATIONS

Office Action in Korean Appln. No. 10-2022-0055726, mailed on Nov. 25, 2025, 21 pages (with English translation).

*Primary Examiner* — Michael Jung
(74) *Attorney, Agent, or Firm* — Fish & Richardson P.C.

(57) ABSTRACT

Provided is a semiconductor package including a support wiring structure, a semiconductor chip on the support wiring structure, a cover wiring structure on the semiconductor chip, and a filling member filling between the support wiring structure and the cover wiring structure, wherein the cover wiring structure includes a cavity which extends from a lower surface of the cover wiring structure into the cover wiring structure and in which an upper portion of the semiconductor chip is positioned, and a first slot and a second slot respectively having a first width and a second width in a first horizontal direction, the first slot and the second slot communicating with the cavity, and respectively extending to a first side surface and a second side surface of the cover wiring structure, which are opposite to each other in a second horizontal direction which is orthogonal to the first horizontal direction of the cover wiring structure.

19 Claims, 20 Drawing Sheets

(51) Int. Cl.
*H10B 80/00* (2023.01)
*H01L 23/00* (2006.01)

(52) U.S. Cl.
CPC ........ *H01L 23/49822* (2013.01); *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01)

(56) References Cited

U.S. PATENT DOCUMENTS

| | | |
|---|---|---|
| 9,136,293 B2 | 9/2015 | Yee et al. |
| 9,666,517 B2* | 5/2017 | Kim ................ H01L 25/105 |
| 10,199,319 B2 | 2/2019 | Shim et al. |
| 10,672,715 B2 | 6/2020 | Kweon et al. |
| 10,930,596 B2 | 2/2021 | Guzek |
| 2013/0161836 A1 | 6/2013 | Yeom et al. |
| 2016/0005714 A1* | 1/2016 | Lee .................. H01L 23/367 257/777 |
| 2018/0145061 A1* | 5/2018 | Jeong ............... H01L 23/5383 |
| 2019/0115325 A1* | 4/2019 | Im ..................... H01L 25/105 |
| 2023/0230908 A1* | 7/2023 | Buot .................. H01L 24/14 257/107 |

* cited by examiner

SEMICONDUCTOR PACKAGE HAVING SEMICONDUCTOR CHIP POSITIONED IN CAVITY OF COVER WIRING STRUCTURE

CROSS-REFERENCE TO RELATED APPLICATION

This application is based on and claims priority under 35 U.S.C. § 119 to Korean Patent Application No. 10-2022-0055726, filed on May 4, 2022, in the Korean Intellectual Property Office, the disclosure of which is incorporated by reference herein in its entirety.

BACKGROUND

The inventive concepts relate to a semiconductor package, and more particularly, to a fan-out semiconductor package.

According to the rapid development of the electronic industry and the needs of users, electronic devices are becoming more miniaturized, multifunctional, and large-capacity, and accordingly, highly integrated semiconductor chips are required.

In particular, in a highly integrated semiconductor chip having an increased number of input/output (I/O) terminals, a distance between I/O terminals may decrease, and thus, interference between the I/O terminals may occur. Therefore, in order to increase a gap between I/O terminals, a fan-out semiconductor package has been developed.

SUMMARY

The inventive concepts provide a semiconductor package formed as a fan-out semiconductor package and having structural reliability.

In order to achieve the above technical problem, the inventive concepts provide a semiconductor package as follows.

According to an aspect of the inventive concepts, there is provided a semiconductor package including a support wiring structure, a semiconductor chip on the support wiring structure, a cover wiring structure on the semiconductor chip, and a filling member filling a space between the support wiring structure and the cover wiring structure, wherein the cover wiring structure includes a cavity which extends from a lower surface of the cover wiring structure to inside of the cover wiring structure and in which an upper portion of the semiconductor chip is positioned, and a first slot and a second slot respectively having a first width and a second width in a first horizontal direction, communicating with the cavity, and extending to a first side surface and a second side surface of the cover wiring structure, the first side surface and the second side surface are opposite to each other in a second horizontal direction orthogonal to the first horizontal direction of the cover wiring structure, wherein the filling member fills the cavity, the first slot, and the second slot.

According to another aspect of the inventive concepts, there is provided a semiconductor package including a support wiring structure, a semiconductor chip on the support wiring structure, a cover wiring structure on the semiconductor chip, a filling member filling a space between the support wiring structure and the cover wiring structure, and a plurality of connection structures passing through the filling member to electrically connect the support wiring structure to the cover wiring structure, wherein the cover wiring structure includes a cavity which extends from a lower surface of the cover wiring structure to inside of the cover wiring structure and in which an upper portion of the semiconductor chip is positioned, and a first slot and a second slot respectively having a first width and a second width in a first horizontal direction, communicating with the cavity, respectively extending to a first side surface and a second side surface of the cover wiring structure, the first side surface and the second side surface are opposite to each other in a second horizontal direction which is orthogonal to the first horizontal direction of the cover wiring structure, and the first slot and the second slot are not overlapping with the plurality of connection structures in a vertical direction, wherein the filling member fills the cavity, the first slot, and the second slot.

According to another aspect of the inventive concepts, there is provided a semiconductor package including a support wiring structure, a semiconductor chip on the support wiring structure, a cover wiring structure on the semiconductor chip and including a multi-layer printed circuit board, a filling member filling a space between the support wiring structure and the cover wiring structure, and a plurality of connection structures passing through the filling member to electrically connect the support wiring structure to the cover wiring structure, the plurality of connection structures being separated from the semiconductor chip, and disposed around the semiconductor chip, wherein the cover wiring structure includes a cavity which extends from a lower surface of the cover wiring structure into the cover wiring structure and in which an upper portion of the semiconductor chip is positioned, and the covering wiring structure includes a first slot and a second slot respectively having a first width and a second width equal to each other in a first horizontal direction, the first slot and the second slot communicating with the cavity, respectively extending to a first side surface and a second side surface of the cover wiring structure, the first side surface and the second side surface are opposite to each other in a second horizontal direction which is orthogonal to the first horizontal direction of the cover wiring structure, and the first slot and the second slot not overlapping with the plurality of connection structures in a vertical direction, and the plurality of connection structures include a plurality of first connection structures used for transmitting a data signal or a control signal and disposed along a third side surface and a fourth side surface of the cover wiring structure, the third side surface and the fourth side surface are opposite to each other in the first horizontal direction, and a plurality of second connection structures used for power or ground transmission and disposed along the first side surface and the second side surface of the cover wiring structure and adjacent to the first slot and the second slot, and the filling member fills the cavity, the first slot, and the second slot.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1A:
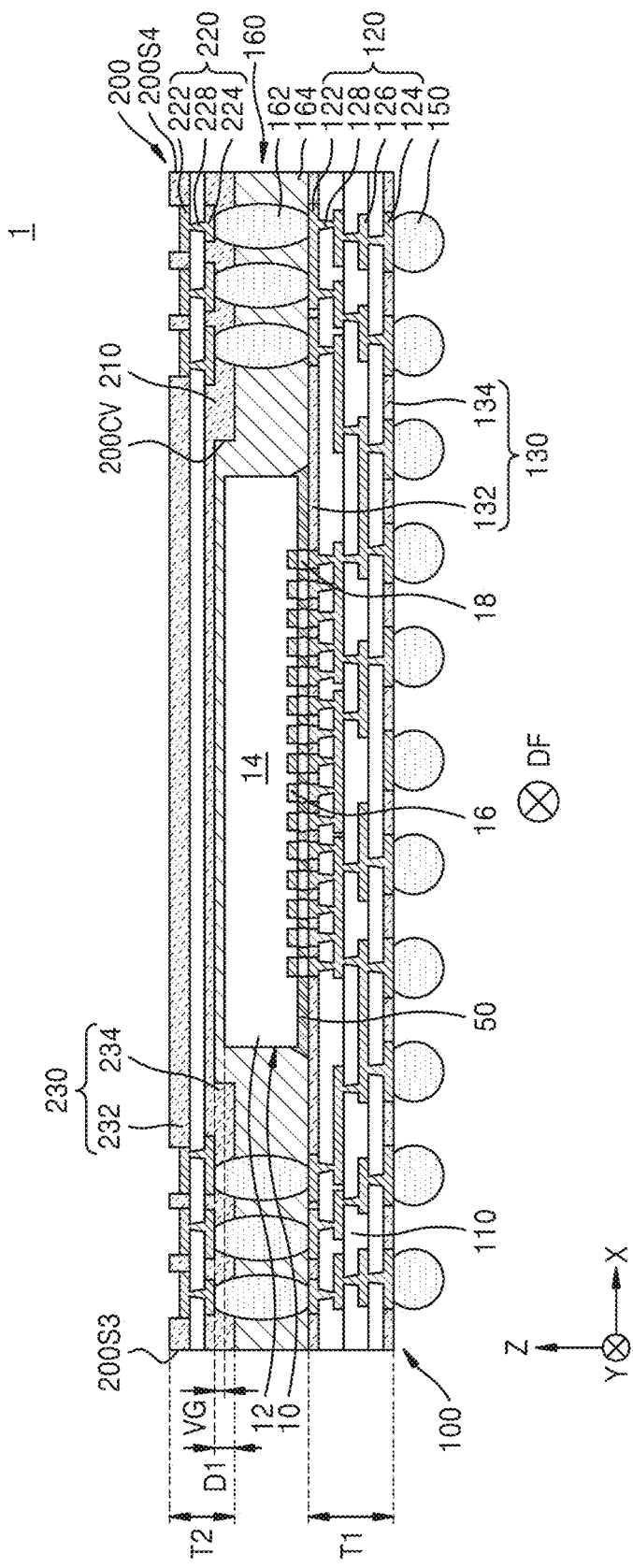
FIGS. 1A and 1B are cross-sectional views illustrating a semiconductor package according to the inventive concepts.
Figure 1B:
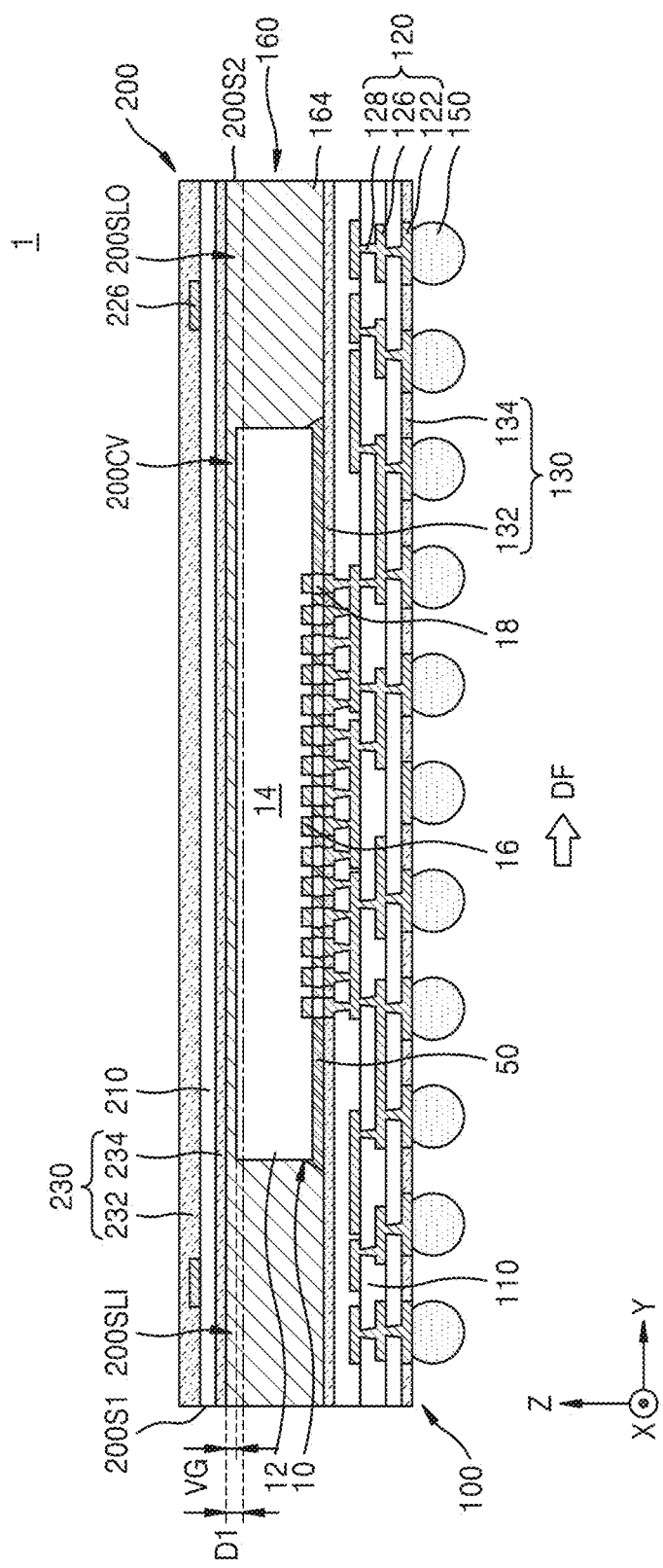

FIGS. 1A and 1B are cross-sectional views illustrating a semiconductor package according to the inventive concepts. Specifically, FIGS. 1A and 1B are cross-sectional views of an example semiconductor package taken along a direction orthogonal to each other. For example, FIG. 1A is a cross-sectional view taken along a first horizontal direction (X direction), and FIG. 1B is a cross-sectional view taken along a second horizontal direction (Y direction).

Referring to FIGS. 1A and 1B together, the semiconductor package 1 includes a support wiring structure 100, an expanded layer 160 on the support wiring structure 100, and a semiconductor chip 10 in the support wiring structure 100, and cover wiring structure 200 on the expanded layer 160. The expanded layer 160 may surround the semiconductor chip 10. In FIGS. 1A and 1i, although it is depicted that the semiconductor package 1 includes one semiconductor chip 10, but this is an example, and the inventive concept is not limited thereto. In some embodiments, the semiconductor package 1 may include a plurality of semiconductor chips 10.

The semiconductor package 1 may be a fan-out semiconductor package in which a horizontal width and a planar area of the support wiring structure 100 and a horizontal width and a planar area of the cover wiring structure 200, respectively, have values greater than a horizontal width and a planar area of a footprint of the semiconductor chip 10. For example, when the semiconductor package 1 includes one semiconductor chip 10, the horizontal width and the planar area of the support wiring structure 100 and the horizontal width and the planar area of the cover wiring structure 200, respectively, may have values greater than the horizontal width and planar area of one semiconductor chip 10. In some embodiments, the support wiring structure 100 and the cover wiring structure 200 may have the same horizontal width and planar area. In some embodiments, corresponding side surfaces of each of the support wiring structure 100, the expanded layer 160, and the cover wiring structure 200 may be coplanar.

The support wiring structure 100 may be referred to as a lower wiring structure or a first wiring structure, and the cover wiring structure 200 may also be referred to as an upper wiring structure or a second wiring structure.

The support wiring structure 100 may be, for example, a printed circuit board (PCB), a ceramic substrate, a wafer for manufacturing a package, or an interposer. In some embodiments, the support wiring structure 100 may be a multi-layer printed circuit board. When the support wiring structure 100 is a printed circuit board, the support wiring structure 100 may also be referred to as a support printed circuit board, a lower printed circuit board, or a first printed circuit board.

The support wiring structure 100 may include a first base insulating layer 110 and a plurality of first wiring patterns 120. The first base insulating layer 110 may include at least one material selected from phenol resin, epoxy resin, and polyimide. The first base insulating layer 110 may include at least one material selected from, for example, Frame Retardant 4 (FR-4), tetrafunctional epoxy, polyphenylene ether, epoxy/polyphenylene oxide, Bismaleimide triazine (BT), Thermount, Cyanate ester, Polyimide, and a Liquid crystal polymer.

The plurality of first wiring patterns 120 may include: a first upper surface wiring pattern disposed on an upper surface of the first base insulating layer 110 and including a plurality of first upper surface pads 122; a first lower surface wiring pattern disposed on a lower surface of the first base insulating layer 110 and including a plurality of first lower surface pads 124; a plurality of first conductive vias 128 passing through the first base insulating layer 110 and electrically connecting the plurality of first wiring patterns 120 disposed on different wiring layers.

In some embodiments, the support wiring structure 100 may further include a first internal wiring pattern 126 extending in a horizontal direction inside the first base insulating layer 110. For example, the first base insulating layer 110 may include a plurality of stacked first base layers, and the first internal wiring pattern 126 may be arranged to form a wiring layer between two adjacent first base layers.

Each of upper and lower ends of the plurality of first conductive vias 128 may contact any one of a portion of the first upper surface wiring pattern, a portion of the first lower surface wiring pattern, or a portion of the first internal wiring pattern 126, respectively. The first wiring pattern 120 may include copper, nickel, stainless steel, or beryllium copper.

The wiring layer denotes an electrical path extending on a plane. The support wiring structure 100 may include wiring layers on the upper surface and the lower surface of the first base insulating layer 110. When the first base insulating layer 110 includes a plurality of stacked first base layers, the support wiring structure 100 may include wiring layers on upper and lower surfaces of each of the plurality of first base layers. For example, the support wiring structure 100 may have one more layer than the number of the first base layers included in the first base insulating layer 110.

When the first base insulating layer 110 includes a plurality of stacked first base layers, the upper surface of the first base insulating layer 110 and the lower surface of the first base insulating layer 110 refer to the uppermost surface of the first base layer and the lowermost surface of the first base layer among the plurality of first base layers.

The support wiring structure 100 may further include a first solder resist layer 130 disposed on the upper surface and the lower surface of the first base insulating layer 110. The first solder resist layer 130 may include a first upper surface solder resist layer 132 that covers the upper surface of the first base insulating layer 110 and exposes the first upper surface pad 122 of the first upper surface wiring patterns and a first lower surface solder resist layer 134 that covers the lower surface of the first base insulating layer 110 and exposes the first lower surface pad 124 of the first lower surface wiring patterns.

In some example embodiments, the first lower surface solder resist layer 134 covering the lower surface of the first base insulating layer 110 may be formed, but the first upper surface solder resist layer 132 covering the upper surface of the first base insulating layer 110 may not be formed.

In some example embodiments, each of the first upper surface solder resist layer 132 and the first lower surface solder resist layer 134 may be formed such that, after applying a solder mask insulation ink on the upper and lower surfaces of the first base insulating layer 110 by using a screen printing method or an inkjet printing method, the solder mask insulation ink is cured with heat, UV or IR.

In some other example embodiments, each of the first upper surface solder resist layer 132 and the first lower surface solder resist layer 134 may be formed such that, after coating a photo-imageable solder resist entirely on the upper and lower surfaces of the first base insulating layer 110 by using a screen printing method or a spray coating method or adhering a film-type solder resist material by using a laminating method, then unnecessary parts are removed by exposure and development, and cured with heat, UV or IR.

The semiconductor chip 10 may include a semiconductor substrate 12 having a semiconductor device 14 on an active surface thereof and a plurality of chip connection pads 16 on the active surface of the semiconductor substrate 12. In some embodiments, when the semiconductor package 1 is a lower package of a package-on-package (PoP), each of the semiconductor package 1, the semiconductor chip 10, the semiconductor substrate 12, the semiconductor device 14, and the chip connection pad 16, respectively, may be referred to as a first semiconductor package, a first semiconductor chip, a first semiconductor substrate, a first semiconductor device, and a first chip connection pad, or a lower semiconductor package, a lower semiconductor chip, a lower semiconductor substrate, a lower semiconductor device, and a lower chip connection pad.

The semiconductor substrate 12 may include, for example, a semiconductor material, such as silicon Si. Alternatively, the semiconductor substrate 12 may include a semiconductor element, such as germanium (Ge), or a compound semiconductor, such as silicon carbide (SiC), gallium arsenide (GaAs), indium arsenide (InAs), and indium phosphide (InP). The semiconductor substrate 12 may include a conductive region, for example, a well doped with an impurity. The semiconductor substrate 12 may have various device isolation structures, such as a shallow trench isolation (STI) structure.

The semiconductor device 14 including a plurality of individual devices of various types may be formed on the active surface of the semiconductor substrate 12. The plurality of individual devices may include various microelectronic devices, for example, a metal-oxide-semiconductor field effect transistor (MOSFET) such as a complementary metal-oxide-semiconductor transistor (CMOS), an image sensor such as a system large scale integration (LSI), CMOS imaging sensor (CIS), etc., a micro-electro-mechanical system (MEMS), an active device, a passive device, and the like. The plurality of individual devices may be electrically connected to the conductive region of the semiconductor substrate 12. The semiconductor device 14 may further include at least two of the plurality of individual devices, or a conductive wire or a conductive plug electrically connecting the plurality of individual devices to the conductive region of the semiconductor substrate 12. In addition, each of the plurality of individual devices may be electrically isolated from other neighboring individual devices by an insulating layer.

The semiconductor chip 10 may be, for example, a central processing unit (CPU) chip, a graphic processing unit (GPU) chip, or an application processor (AP) chip. In some embodiments, when the semiconductor package 1 includes a plurality of semiconductor chips 10, some of the plurality of semiconductor chips 10 may be a central processing unit chip, a graphic processing unit chip, or an application processor chip, some other part of the plurality of semiconductor chips 10 may be, for example, a dynamic random access memory (DRAM) chip, a static random access memory (SRAM) chip, a flash memory chip, electrically erasable and programmable read-only memory (EEPROM) chip, a phase-change random access memory (PRAM) chip, a magnetic random access memory (MRAM) chip, or a resistive random access memory (RRAM) chip.

The semiconductor chip 10 may be mounted on the support wiring structure 100 in a flip-chip method. That is, the semiconductor chip 10 may be mounted on the support wiring structure 100 such that the active surface of the semiconductor substrate 12 faces the support wiring structure 100.

The plurality of chip connection pads 16 of the semiconductor chip 10 electrically connected to the semiconductor device 14 may be electrically connected to the support wiring structure 100. A plurality of chip connection terminals 18 are disposed between some of the plurality of first upper surface pads 122 and the plurality of chip connection pads 16 to electrically connect the semiconductor chip 10 to the plurality of the first wiring patterns 120. For example, the plurality of chip connection terminals 18 may be solder balls or bumps.

In some example embodiments, an underfill layer 50 surrounding the plurality of chip connection terminals 18 may be interposed between the semiconductor chip 10 and the support wiring structure 100. The underfill layer 50 may include, for example, an epoxy resin formed by a capillary under-fill method. In some example embodiments, the underfill layer 50 may cover at least a portion of a side surface of the semiconductor chip 10.

The expanded layer 160 may include a plurality of connection structures 162 and a filling member 164 surrounding the plurality of connection structures 162 and the semiconductor chip 10. The plurality of connection structures 162 may be separated from the semiconductor chip 10, and may be disposed around the semiconductor chip 10. The plurality of connection structures 162 may pass through the filling member 164 to electrically connect the support wiring structure 100 to the cover wiring structure 200. Upper and lower ends of each of the plurality of connection structures 162 may be connected to any one of a plurality of second lower surface pads 224 of the cover wiring structure 200 and any one of a plurality of first upper surface pads 122 of the support wiring structure 100.

Each of the plurality of connection structures 162 may include a through mold via (TMV), conductive solder, conductive pillars, or at least one conductive bump. In some example embodiments, each of the plurality of connection structures 162 may be formed such that a lower portion formed to be attached to any one of the plurality of first upper surface pads 122 of the support wiring structure 100 and an upper portion formed to be attached to any one of the plurality of second lower surface pads 224 of the cover wiring structure 200 are reflowed by heat and soldered to form an integral body.

The filling member 164 may include, for example, an epoxy mold compound (EMC). The filling member 164 may include a filler. For example, the filling member 164 may include an epoxy-based material including a filler. In some example embodiments, the proportion of filler included in the filling member 164 may be in a range from about 55 wt % to about 85 wt %. The filler may be, for example, a silica filler. An average diameter of the filler may be 0.1 µm to several tens of m.

The cover wiring structure 200 may include, for example, a printed circuit board (PCB), a ceramic substrate, a wafer for manufacturing a package, or an interposer. In some example embodiments, the cover wiring structure 200 may include a multi-layer printed circuit board. When the cover wiring structure 200 is a printed circuit board, the cover wiring structure 200 may also be referred to as a cover printed circuit board, an upper printed circuit board, or a second printed circuit board.

The cover wiring structure 200 may include a second base insulating layer 210 and a plurality of second wiring patterns 220. The second base insulating layer 210 may include at least one material selected from phenol resin, epoxy resin, and polyimide.

The plurality of second wiring patterns 220 may include a second upper surface wiring pattern 226 disposed on an upper surface of the second base insulating layer 210 and including a plurality of second upper surface pads 222; a second lower surface wiring pattern disposed on a lower surface of the second base insulating layer 210 and including a plurality of second lower surface pads 224; and a plurality of second conductive vias 228 passing through the second base insulating layer 210 and electrically connecting the second wiring patterns 220 disposed on different wiring layers from each other.

In some example embodiments, when the second base insulating layer 210 includes a plurality of stacked second base layers, the second wiring pattern 220 may further include a second internal wiring pattern that is disposed to form a wiring layer between two adjacent second base insulating layers 210 and is similar to the first internal wiring pattern 126. Each of upper and lower ends of the plurality of second conductive vias 228 may contact any one of a portion of a second upper surface wiring pattern 226, a portion of a second lower surface wiring pattern, or a portion of the second internal wiring pattern. The second wiring pattern 220 may include copper, nickel, stainless steel, or beryllium copper.

The cover wiring structure 200 may include a first side surface 200S1 and a second side surface 200S2 that are opposite to each other in a second horizontal direction (Y direction), and a third side surface 200S3 and a fourth side surface 200S4 that are opposite to each other in the first horizontal direction (X direction).

In FIG. 1B, it is illustrated that the support wiring structure 100 has four wiring layers and the cover wiring structure 200 has two wiring layers but this is an example, and the inventive concept is not limited thereto. In some embodiments, the number of wiring layers included in the support wiring structure 100 may be greater than the number of wiring layers included in the cover wiring structure 200. The support wiring structure 100 may have a first thickness T1, and the cover wiring structure 200 may have a second thickness T2. The second thickness T2 may be less than the first thickness T1. For example, the first thickness T1 may be in a range from about 80 µm to about 200 m, and the second thickness T2 may be in a range from about 50 µm to about 100 µm.

The cover wiring structure 200 may further include a second solder resist layer 230 disposed on the upper and lower surfaces thereof. The second solder resist layer 230 may include a second upper surface solder resist layer 232 covering the upper surface of the second base insulating layer 210 and exposing the second upper surface pad 222 of a second upper surface wiring patterns 226 and a second lower surface solder resist layer 234 covering the lower surface of the second base insulating layer 210 and exposing a second lower surface pad 224 of the second bottom wiring pattern.

In some example embodiments, each of the second upper surface solder resist layer 232 and the second lower surface solder resist layer 234 may be formed such that, after a solder mask insulating ink is applied on the upper and lower surfaces of the second base insulating layer 210 by using a screen printing method or an inkjet printing method, the solder mask insulation ink is cured with heat, UV, or IR.

In some other example embodiments, each of the second upper surface solder resist layer 232 and the first lower surface solder resist layer 234 may be formed such that, after applying a photosensitive solder resist entirely on the upper and lower surfaces of the second base insulating layer 210 by using a screen printing method or a spray coating method, or adhering a film-type solder resist material by using a laminating method, then unnecessary parts are removed by exposure and development, and cured with heat, UV or IR.

In FIGS. 1A and 1B, for convenience of illustration, only the first upper surface pad 122 of the first upper surface wiring patterns is shown, only the first lower surface pad 124 of the first lower surface wiring patterns is shown, and only the second lower surface pad 224 of the second lower surface wiring patterns is illustrated. However, the support wiring structure 200 may include a portion of the first upper surface wiring pattern extending along between the first base insulating layer 110 and the first upper surface solder resist layer 132 and/or a portion of the first lower surface wiring pattern extending along between the first base insulating layer 110 and the first lower surface solder resist layer 134, and the cover wiring structure 200 may further include a portion of the second lower surface wiring pattern extending along between the second base insulating layer 210 and the second lower surface solder resist layer 234.

In a plan view, the cover wiring structure 200 may have a cavity 200CV extending from the lower surface of the cover wiring structure 200 to inside of the cover wiring structure 200 near the center. The cavity 200CV may be separated from the side surfaces 200S1, 200S2, 200S3, and 200S4 of the cover wiring structure 200. Although it will be described in detail with reference to FIGS. 2A to 2G, the cavity 200CV may have a planar rectangular shape. A planar area inside the cavity 200CV may be greater than a planar area of the semiconductor chip 10. In a plan view, the semiconductor chip 10 may be vertically overlapped in the cavity 200CV of the cover wiring structure 200.

An upper portion of the semiconductor chip 10 may be positioned in the cavity 200CV. The semiconductor chip 10 may have an upper portion positioned within the cavity 200CV, but may be separated from the cover wiring structure 200. The semiconductor chip 10 and the cover wiring structure 200 may be separated from each other with a vertical distance VG in the vertical direction (Z direction). For example, the vertical distance VG may be in a range from about 10 m to about 40 µm. A filling member 164 may be filled between the semiconductor chip 10 and the cover wiring structure 200.

The cover wiring structure 200 may have a first slot 200SLI and a second slot 200SLO connected to the cavity 200CV and extending to opposite side surfaces of the cover wiring structure 200, respectively. The first slot 200SLI may extend from a first side surface 200S1 of the cover wiring structure 200 to the cavity 200CV, and the second slot 200SLO may extend from the second side surface 200S2 of the cover wiring structure 200 to the cavity 200CV.

In some example embodiments, each of the first slot 200SLI and the second slot 200SLO may have a bar-shaped planar cross-section extending in the second horizontal direction (Y direction), or a rectangular cross-section having a long axis in the second horizontal direction (Y direction). In some other example embodiments, each of the first slot 200SLI and the second slot 200SLO may have a plane cross-section of a trapezoid shape in which a horizontal width increases while extending in a direction from the first side surface 200S1 to the second side surface 200S2, that is, in the second horizontal direction (Y direction) or a planar cross-section close to a semicircular shape.

The filling member 164 may be formed by being injected between the support wiring structure 100 and the cover wiring structure 200. The filling member 164 may fill the cavity 200CV, the first slot 200SLI, and the second slot 200SLO between the support wiring structure 100 and the cover wiring structure 200. The filling member 164 may be injected between the support wiring structure 100 and the cover wiring structure 200 along an injection direction DF. In some embodiments, the injection direction DF may be a direction from the first side surface 200S1 of the cover wiring structure 200 towards the second side surface 200S2 of the cover wiring structure 200, that is, the second horizontal direction (Y direction).

The cavity 200CV, the first slot 200SLI, and the second slot 200SLO each may have the same first depth D1 from a lowermost surface of the cover wiring structure 200 and may extend into the cover wiring structure 200. A first depth D1 may be greater than the vertical distance VG and less than the first thickness T1. For example, the first depth D1 may be in a range from about m to about 60 μm.

Each of the cavity 200CV, the first slot 200SLI, and the second slot 200SLO may extend from a lower surface of the second lower surface solder resist layer 234 into the second lower surface solder resist layer 234, but may not extend into the second base insulating layer 210. For example, the first depth D1 may have a value less than a thickness of the second lower surface solder resist layer 234.

In some example embodiments, the second bottom solder resist layer 234 may include a first layer covering a lower surface of the second base insulating layer 210 and a second layer covering a lower surface of the first layer. Each of the cavity 200CV, the first slot 200SLI, and the second slot 200SLO may be formed to pass through the second layer, but not to penetrate the first layer. That is, each of the cavity 200CV, the first slot 200SLI, and the second slot 200SLO may be formed to be defined by the second layer.

The semiconductor package 1 may include a plurality of external connection terminals 150 attached to the plurality of first lower surface pads 124. For example, a height of each of the plurality of external connection terminals 150 may be about 150 μm. For example, the plurality of external connection terminals 150 may be solder balls.

In the semiconductor package 1 according to the inventive concepts, the cover wiring structure 200 includes a cavity 200CV, a first slot 200SLI, and a second slot 200SLO. The cover wiring structure 200 having the cavity 200CV and the semiconductor chip 10 are separated from each other, and each of the first slot 200SLI and the second slot 200SLO communicates with the cavity 200CV. Accordingly, the filling member 164 may be smoothly implanted along the gap between the cover wiring structure 200 and the semiconductor chip 10. In addition, because the first slot 200SLI and the second slot 200SLO extend along an injection direction DF of the filling member 164, it is possible to prevent the occurrence of a void defect in which the filling member 164 is not filled in the cavity 200CV. In addition, because a flux used in the process of manufacturing the semiconductor package 1 is discharged to the outside through the first slot 200SLI and the second slot 200SLO, it is possible to prevent flux from remaining in the semiconductor package 1, for example, in the cavity 200CV.

Accordingly, the semiconductor package 1 according to the inventive concepts may have structural reliability because a void defect in which the filling member 164 is not filled does not occur and flux does not remain therein.

FIGS. 2A to 2G are planar layouts illustrating planar arrangements of main components of semiconductor packages according to the inventive concepts. The planar layouts of the semiconductor packages 1a, 1b, 1c, 1d, 1e, 1f, and 1g of FIGS. 2A to 2G may be the plan layouts of the semiconductor package 1 shown in FIGS. 1A and 1, and FIGS. 2A to 2G, and in the description of FIGS. 2A to 2G, descriptions already given with reference to FIGS. 1A and 1B may be omitted.

Figure 2A:
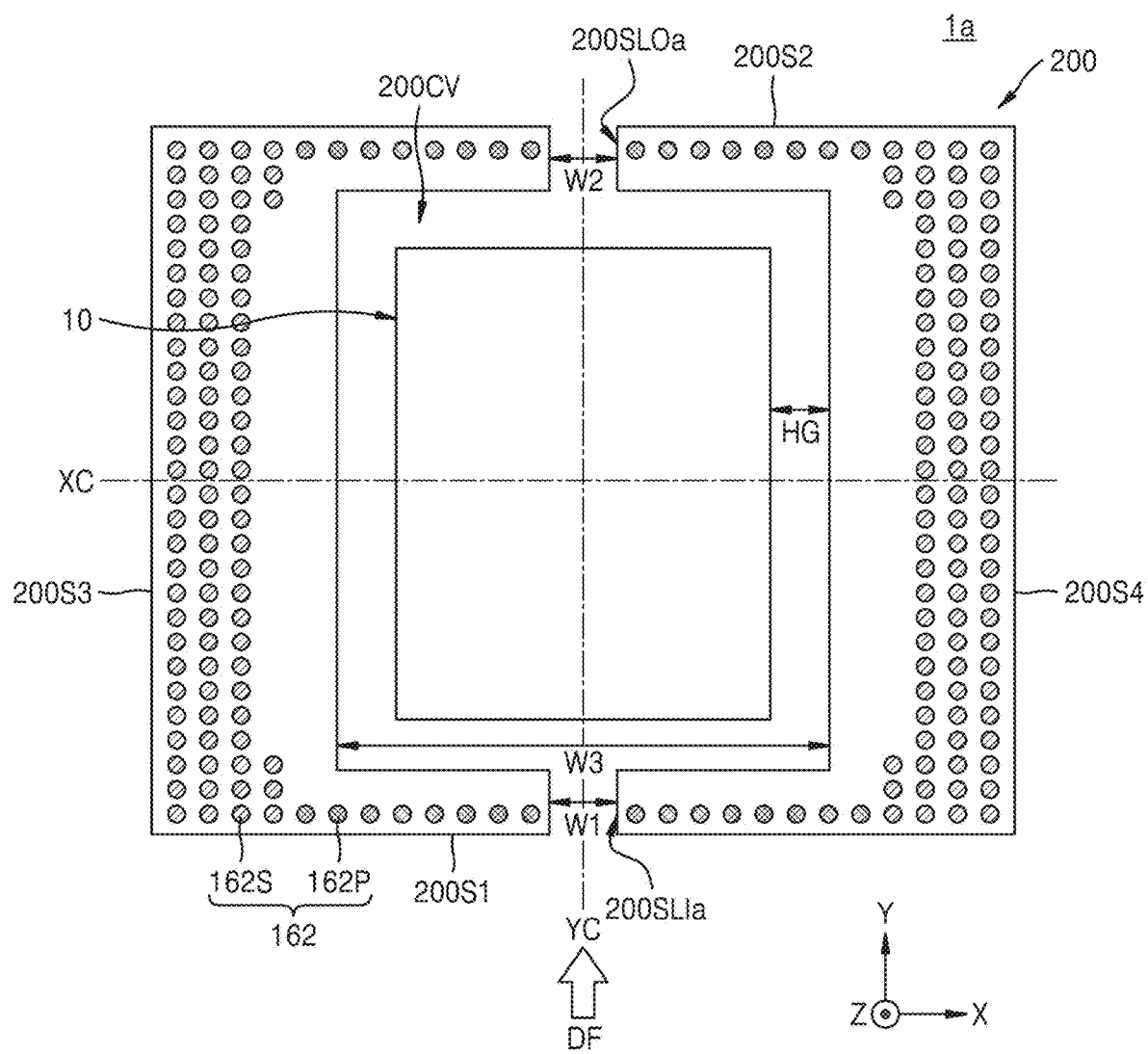
FIGS. 2A to 2G are planar layouts illustrating a planar arrangement of main components of a semiconductor package according to the inventive concepts.

Referring to FIG. 2A, the semiconductor package 1a includes a semiconductor chip 10, a cover wiring structure 200, and a plurality of connection structures 162 electrically connected to the cover wiring structure 200.

The cover wiring structure 200 may include a cavity 200CV, a first slot 200SLIa, and a second slot 200SLOa. The cavity 200CV may be separated from side surfaces 200S1, 200S2, 200S3, and 200S4 of the cover wiring structure 200. The cavity 200CV may have a planar rectangular shape. A planar area inside the cavity 200CV may have a value greater than a planar area of the semiconductor chip 10. In a plan view, the cavity 200CV of the cover wiring structure 200 may vertically overlap the semiconductor chip 10.

A portion of the semiconductor chip 10 may be positioned in the cavity 200CV. For example, an upper portion of the semiconductor chip 10 may be positioned in the cavity 200CV. An upper portion of the semiconductor chip 10 may be positioned in the cavity 200CV. The semiconductor chip 10 and the cover wiring structure 200 may be separated from each other with a horizontal distance HG in a horizontal direction (X-direction or Y-direction). For example, the horizontal distance HG may be in a range from about 200 μm to about 1 mm. The filling member 164 shown in FIGS. 1A and 1B may be filled between the semiconductor chip 10 and the cover wiring structure 200.

The cover wiring structure 200 may include the first slot 200SLIa and the second slot 200SLOa connected to the cavity 200CV and extending to opposite side surfaces of the cover wiring structure 200, respectively. The first slot 200SLIa and the second slot 200SLOa may be the first slot 200SLI and the second slot 200SLO shown in FIG. 1B. In some example embodiments, the cover wiring structure 200 may have one first slot 200SLIa and one second slot 200SLOa connected to the cavity 200CV.

The first slot 200SLIa may extend from the first side surface 200S1 of the cover wiring structure 200 to the cavity 200CV, and the second slot 200SLOa may extend from the second side surface 200S2 of the cover wiring structure 200 to the cavity 200CV. The first slot 200SLIa and the second slot 200SLOa may be positioned to be aligned with each other in the second horizontal direction (Y direction).

Each of the first slot 200SLIa and the second slot 200SLOa may have a bar-shaped planar cross-section extending in the second horizontal direction (Y direction), or a planar cross-section having a rectangular shape having a long axis in the second horizontal direction (Y direction). In the first horizontal direction (X direction), the first slot 200SLIa may have a first width W1, the second slot 200SLOa may have a second width W2, and the cavity 200CV may have a third width W3. The first width W1 and the second width W2 may have the same value. That is, each of the first slot 200SLIa and the second slot 200SLOa may have the same width in the first horizontal direction (X direction). For example, the first width W1 and the second width W2 may be in a range from about 300 μm to about 800 μm. For example, the third width W3 may be in a range from about 5 mm to about 20 mm, but is not limited thereto. The third width W3 may have various values according to the size of the semiconductor chip 10.

For example, the cover wiring structure 200 may have a symmetrical structure with respect to the first center line XC extending in the first horizontal direction (X direction). For example, the cover wiring structure 200 may have a symmetrical structure with respect to the second center line YC extending in the second horizontal direction (Y direction). That is, the first slot 200SLIa and the second slot 200SLOa may be arranged to be symmetrical with respect to each of the first center line XC and the second center line YC in the cover wiring structure 200.

The first slot 200SLIa and the second slot 200SLOa may not vertically overlap the plurality of connection structures 162. In a plan view, the first slot 200SLIa and the second slot 200SLOa may be positioned to be separated from the plurality of connection structures 162 in the first horizontal direction (X direction). The plurality of connection structures 162 may include a plurality of first connection structures 162S and a plurality of second connection structures 162P. The first connection structures 162S may be used to transmit a data signal or a control signal, and the second connection structures 162P may be used to transmit power or a ground. The first connection structures 162S may be disposed along the third side surface 200S3 and the fourth side surface 200S4 of the cover wiring structure 200, and the second connection structures 162P may be disposed along the first side surface 200S1 and the second side surface 200S2.

A connection structure 162 adjacent to the first slot 200SLIa and the second slot 200SLOa among the plurality of connection structures 162 may be a second connection structure 162P. Some of the plurality of second connection structures 162P may be used for power transmission and others may be used for ground transmission. The second connection structure 162P used for power transmission and the second connection structure 162P used for ground transmission may be plural, respectively. Accordingly, even if the second connection structure 162P is not arranged in a portion where each of the first slot 200SLIa and the second slot 200SLOa vertically overlaps, the operation of the semiconductor package 1a may not be affected.

The filling member 164 may be implanted into the semiconductor package 1a along the injection direction DF shown in FIGS. 1A and 1B. In some embodiments, the injection direction DF is a direction from the first side surface 200S1 of the cover wiring structure 200 to the second side surface 200S2 of the cover wiring structure 200, that is, the second horizontal direction (Y direction). Because the first slot 200SLI and the second slot 200SLO extend along the injection direction DF of the filling member 164, it is possible to prevent a void defect in which the filling member 164 is not filled in the cavity 200CV. In addition, because flux used in the process of manufacturing the semiconductor package 1a is discharged to the outside through the first slot 200SLIa and the second slot 200SLOa, it is possible to prevent flux from remaining in the semiconductor package 1a, for example, in the cavity 200CV.

Accordingly, the semiconductor package 1a according to the inventive concepts may have structural reliability because a void defect does not occur and flux does not remain therein.

Figure 2B:
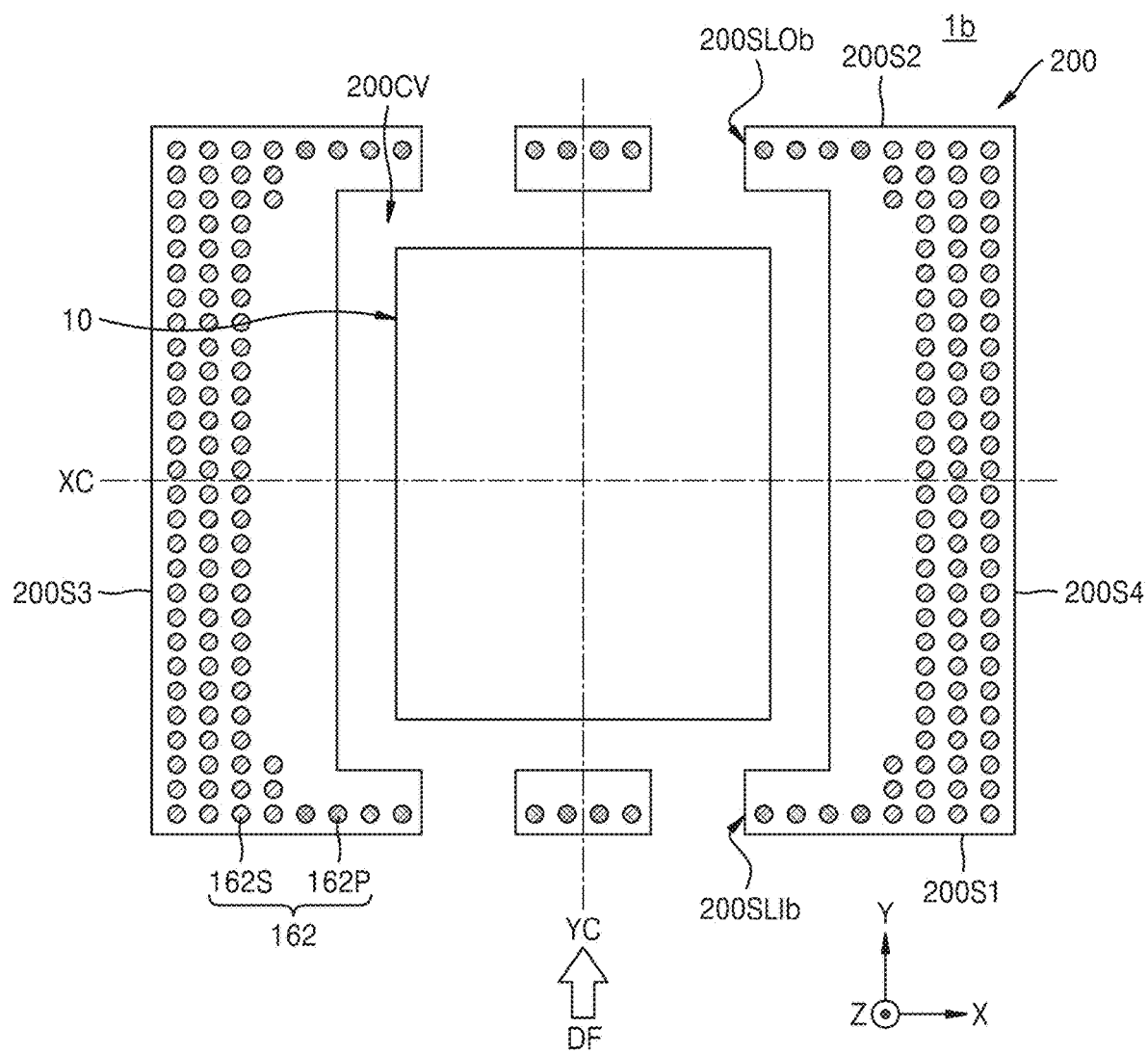

Referring to FIG. 2B, the semiconductor package 1b includes a semiconductor chip 10, a cover wiring structure 200, and a plurality of connection structures 162 electrically connected to the cover wiring structure 200.

The cover wiring structure 200 may include a cavity 200CV, a first slot 200SLIb, and a second slot 200SLOb. The cavity 200CV may be separated from side surfaces 200S1, 200S2, 200S3, and 200S4 of the cover wiring structure 200. The cavity 200CV may have a planar rectangular shape.

A portion of the semiconductor chip 10 may be positioned in the cavity 200CV. The filling member 164 shown in FIGS. 1A and 1B may be filled between the semiconductor chip 10 and the cover wiring structure 200.

The cover wiring structure 200 may include a first slot 200SLIb and a second slot 200SLOb connected to the cavity 200CV and extending to opposite side surfaces of the cover wiring structure 200, respectively. The first slot 200SLIb and the second slot 200SLOb may be the first slot 200SLI and the second slot 200SLO shown in FIG. 1B. In some example embodiments, the cover wiring structure 200 may have two first slots 200SLIb and two second slots 200SLOb connected to the cavity 200CV. The two first slots 200SLIb may be separated from each other in a first horizontal direction (X direction), and the two second slots 200SLOb may be separated from each other in the first horizontal direction (X direction).

The first slot 200SLIb may extend from the first side surface 200S1 of the cover wiring structure 200 to the cavity 200CV, and the second slot 200SLOb may extend from the second side surface 200S2 of the cover wiring structure 200 to the cavity 200CV.

The first slot 200SLIb and the second slot 200SLOb may be positioned to be aligned with each other in the second horizontal direction (Y direction). For example, one of the two first slots 200SLIb and one of the two second slots 200SLOb may be positioned to be aligned with each other in the second horizontal direction (Y direction), and the other one of the two first slots 200SLIb and the other one of the two second slots 200SLOb may be positioned to be aligned with each other in the second horizontal direction (Y direction).

Each of the first slot 200SLIb and the second slot 200SLOb may have a bar-shaped planar cross-section extending in the second horizontal direction (Y direction), or a planar cross-section of a rectangular shape having a long axis in a second horizontal direction (Y direction). Each of the first slot 200SLIb and the second slot 200SLOb may have the same width in the first horizontal direction (X direction).

For example, the cover wiring structure 200 may have a symmetrical structure with respect to the first center line XC extending in the first horizontal direction (X direction). For example, the cover wiring structure 200 may have a symmetrical structure with respect to the second center line YC extending in the second horizontal direction (Y direction). That is, the first slot 200SLIb and the second slot 200SLOb may be arranged to be symmetrical with respect to each of the first center line XC and the second center line YC in the cover wiring structure 200.

The first slot 200SLIb and the second slot 200SLOb may not vertically overlap the plurality of connection structures 162. In a plan view, the first slot 200SLIb and the second slot 200SLOb may be positioned to be separated from the plurality of connection structures 162 in the first horizontal direction (X direction). The plurality of connection structures 162 may include a plurality of first connection structures 162S and a plurality of second connection structures 162P. A connection structure 162 adjacent to the first slot 200SLIb and the second slot 200SLOb among the plurality of connection structures 162 may be a second connection structure 162P.

Figure 2C:
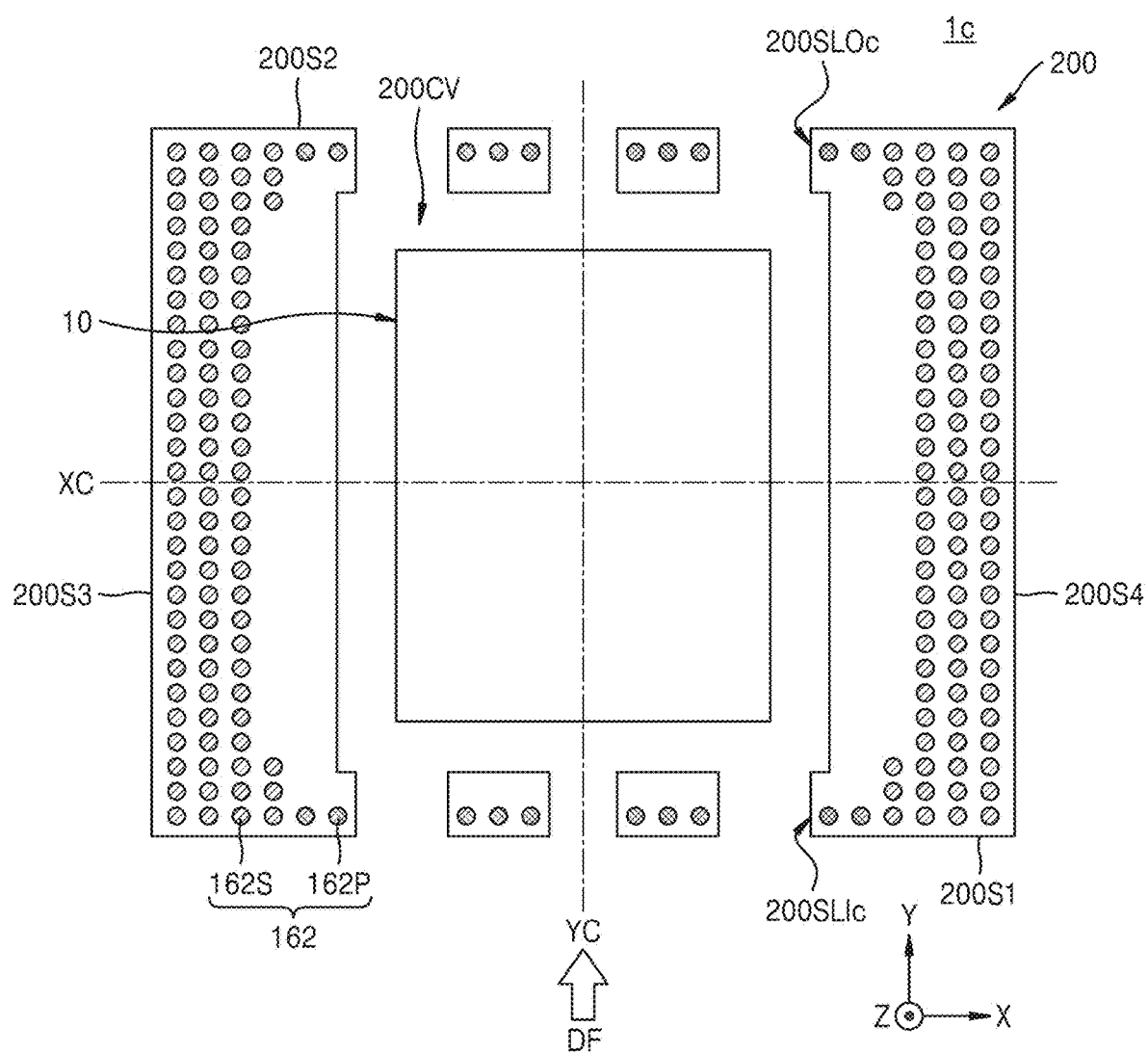

Referring to FIG. 2C, the semiconductor package 1c includes a semiconductor chip 10, a cover wiring structure 200, and a plurality of connection structures 162 electrically connected to the cover wiring structure 200.

The cover wiring structure 200 may include a cavity 200CV, a first slot 200SLIc, and a second slot 200SLOc. The cavity 200CV may be separated from side surfaces 200S1, 200S2, 200S3, and 200S4 of the cover wiring structure 200. The cavity 200CV may have a planar rectangular shape.

A portion of the semiconductor chip 10 may be positioned in the cavity 200CV. The filling member 164 shown in FIGS. 1A and 1B may be filled between the semiconductor chip 10 and the cover wiring structure 200.

The cover wiring structure 200 may include the first slot 200SLIc and the second slot 200SLOc connected to the cavity 200CV and extending to opposite side surfaces of the cover wiring structure 200, respectively. The first slot 200SLIc and the second slot 200SLOc may be the first slot 200SLI and the second slot 200SLO shown in FIG. 1B. In some embodiments, the cover wiring structure 200 may have a plurality of first slots 200SLIc and a plurality of second slots 200SLOc connected to the cavity 200CV. The plurality of first slots 200SLIc may be separated from each other in a first horizontal direction (X direction), and the plurality of second slots 200SLOc may be separated from each other in a first horizontal direction (X direction). In FIG. 2C, although the cover wiring structure 200 is illustrated as including three first slots 200SLIc and three second slots 200SLOc, the inventive concept is not limited thereto, and the cover wiring structure 200 may include four or more first slots 200SLIc and four or more second slots 200SLOc.

The first slot 200SLIc may extend from the first side surface 200S1 of the cover wiring structure 200 to the cavity 200CV, and the second slot 200SLOc may extend from the second side surface 200S2 of the cover wiring structure 200 to the cavity 200CV. The first slot 200SLIc and the second slot 200SLOc corresponding to each other may be positioned to be aligned with each other in the second horizontal direction (Y direction).

Each of the first slot 200SLIc and the second slot 200SLOc may have a bar-shaped planar cross-section extending in the second horizontal direction (Y direction), or a planar cross-section of a rectangular shape having a long axis in the second horizontal direction (Y direction). Each of the first slot 200SLIc and the second slot 200SLOc may have the same width in the first horizontal direction (X direction).

For example, the cover wiring structure 200 may have a symmetrical structure with respect to the first center line XC extending in the first horizontal direction (X direction). For example, the cover wiring structure 200 may have a symmetrical structure with respect to the second center line YC extending in the second horizontal direction (Y direction). That is, the first slot 200SLIc and the second slot 200SLOc may be disposed to be symmetrical with respect to each of the first center line XC and the second center line YC in the cover wiring structure 200.

The first slot 200SLIc and the second slot 200SLOc may not vertically overlap the plurality of connection structures 162. In a plan view, the first slot 200SLIc and the second slot 200SLOc may be positioned to be separated from the plurality of connection structures 162 in the first horizontal direction (X direction). The plurality of connection structures 162 may include a plurality of first connection structures 162S and a plurality of second connection structures 162P. A connection structure 162 adjacent to the first slot 200SLIc and the second slot 200SLOc among the plurality of connection structures 162 may be a second connection structure 162P.

Figure 2D:
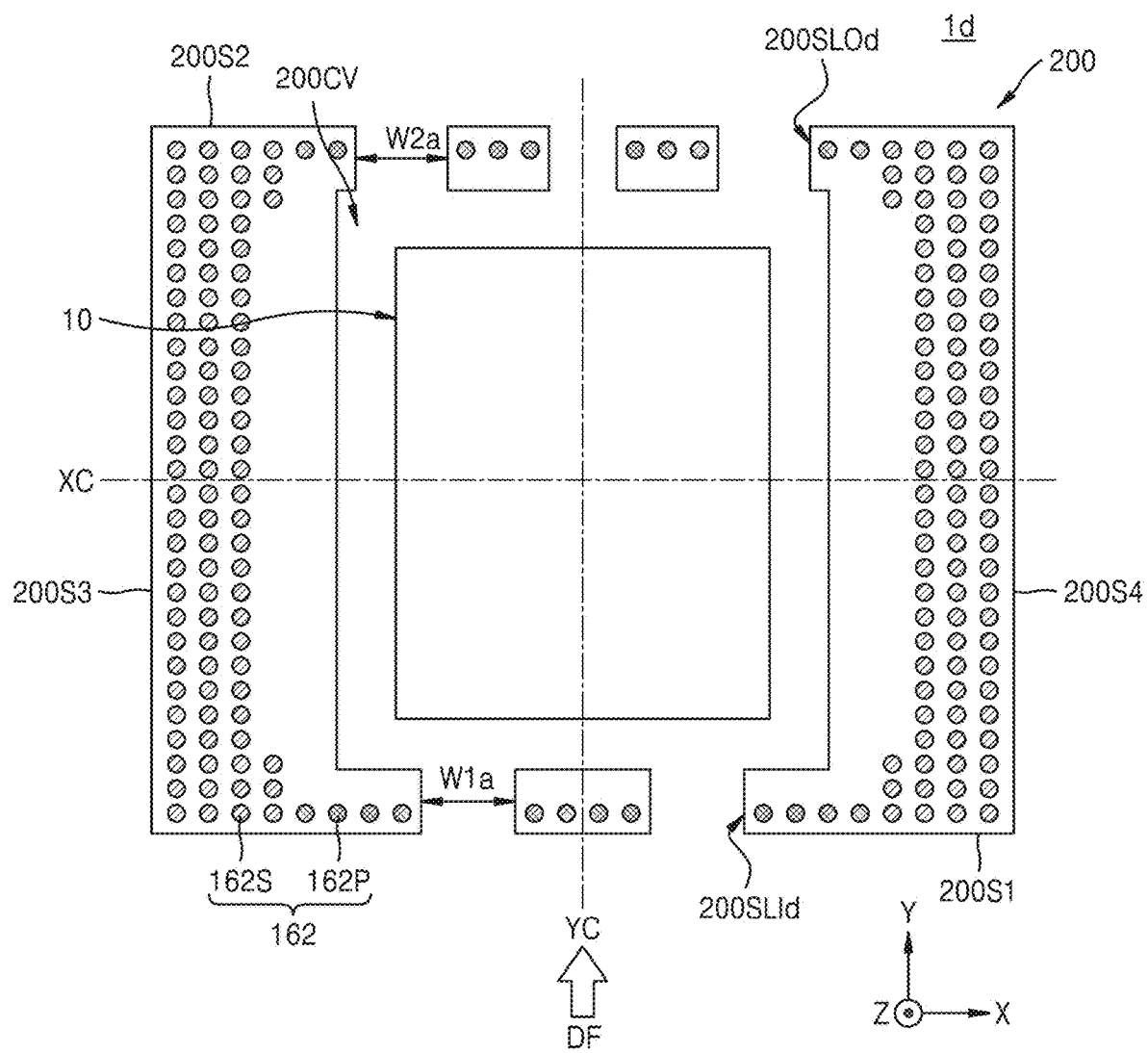

Referring to FIG. 2D, the semiconductor package 1d includes a semiconductor chip 10, a cover wiring structure 200, and a plurality of connection structures 162 electrically connected to the cover wiring structure 200.

The cover wiring structure 200 may include a cavity 200CV, a first slot 200SLId, and a second slot 200SLOd. The cavity 200CV may be separated from side surfaces 200S1, 200S2, 200S3, and 200S4 of the cover wiring structure 200. The cavity 200CV may have a planar rectangular shape.

A portion of the semiconductor chip 10 may be positioned in the cavity 200CV. The filling member 164 shown in FIGS. 1A and 1B may be filled between the semiconductor chip 10 and the cover wiring structure 200.

The cover wiring structure 200 may include the first slot 200SLId and the second slot 200SLOd connected to the cavity 200CV and extending to opposite side surfaces of the cover wiring structure 200, respectively. The first slot 200SLId and the second slot 200SLOd may be the first slot 200SLI and the second slot 200SLO shown in FIG. 1B. In some embodiments, the cover wiring structure 200 may have at least one first slot 200SLId and a plurality of second slots 200SLOd connected to the cavity 200CV. The number of second slots 200SLOd included in the cover wiring structure 200 may be greater than the number of first slots 200SLId. In FIG. 2D, the cover wiring structure 200 is illustrated as including two first slots 200SLId and three second slots 200SLOd, but is not limited thereto. For example, the cover wiring structure 200 may include one first slot 200SLId or three or more first slots 200SLId, and may include the second slots 200 SLOd in a number of one or more than the number of first slots 200SLId.

The first slot 200SLId may extend from the first side surface 200S1 of the cover wiring structure 200 to the cavity 200CV, and the second slot 200SLOd may extend from the second side surface 200S2 of the cover wiring structure 200 to the cavity 200CV. In FIG. 2D, although it is illustrated that the first slot 200SLId and the second slot 200SLOd are not aligned in the second horizontal direction (Y direction), the inventive concept is not limited thereto. For example, at least one first slot 200SLId and at least one second slot 200SLOd among the plurality of second slots 200SLOd may be aligned with each other in the second horizontal direction (Y direction).

Each of the first slot 200SLId and the second slot 200SLOd may have a bar-shaped planar cross-section extending in the second horizontal direction (Y direction), or a planar cross-section of a rectangular shape having a long axis in the second horizontal direction (Y direction). In the first horizontal direction (X direction), the first slot 200SLId may have a first width W1a, and the second slot 200SLOd may have a second width W2a. In some embodiments, the first width W1a and the second width W2a may have the same value. In some other embodiments, the first width W1a and the second width W2a may have different values. For example, the product of the number of second slots 200SLOd and the second width W2a of the cover wiring structure 200 may be greater than the product of the number of the first slots 200SLId and the first width W1a.

For example, the cover wiring structure 200 may have an asymmetric structure with respect to the first center line XC extending in the first horizontal direction (X direction). For example, the cover wiring structure 200 may have a symmetrical structure with respect to the second center line YC extending in the second horizontal direction (Y direction). That is, the first slot 200SLId and the second slot 200SLOd may be disposed to be symmetrical with respect to the second center line YC in the cover wiring structure 200.

The first slot 200SLId and the second slot 200SLOd may not vertically overlap the plurality of connection structures 162. In a plan view, the first slot 200SLId and the second slot 200SLOd may be positioned to be separated from the plurality of connection structures 162 in the first horizontal direction (X direction). The plurality of connection structures 162 may include a plurality of first connection structures 162S and a plurality of second connection structures 162P. A connection structure 162 adjacent to the first slot 200SLId and the second slot 200SLOd among the plurality of connection structures 162 may be a second connection structure 162P.

Figure 2E:
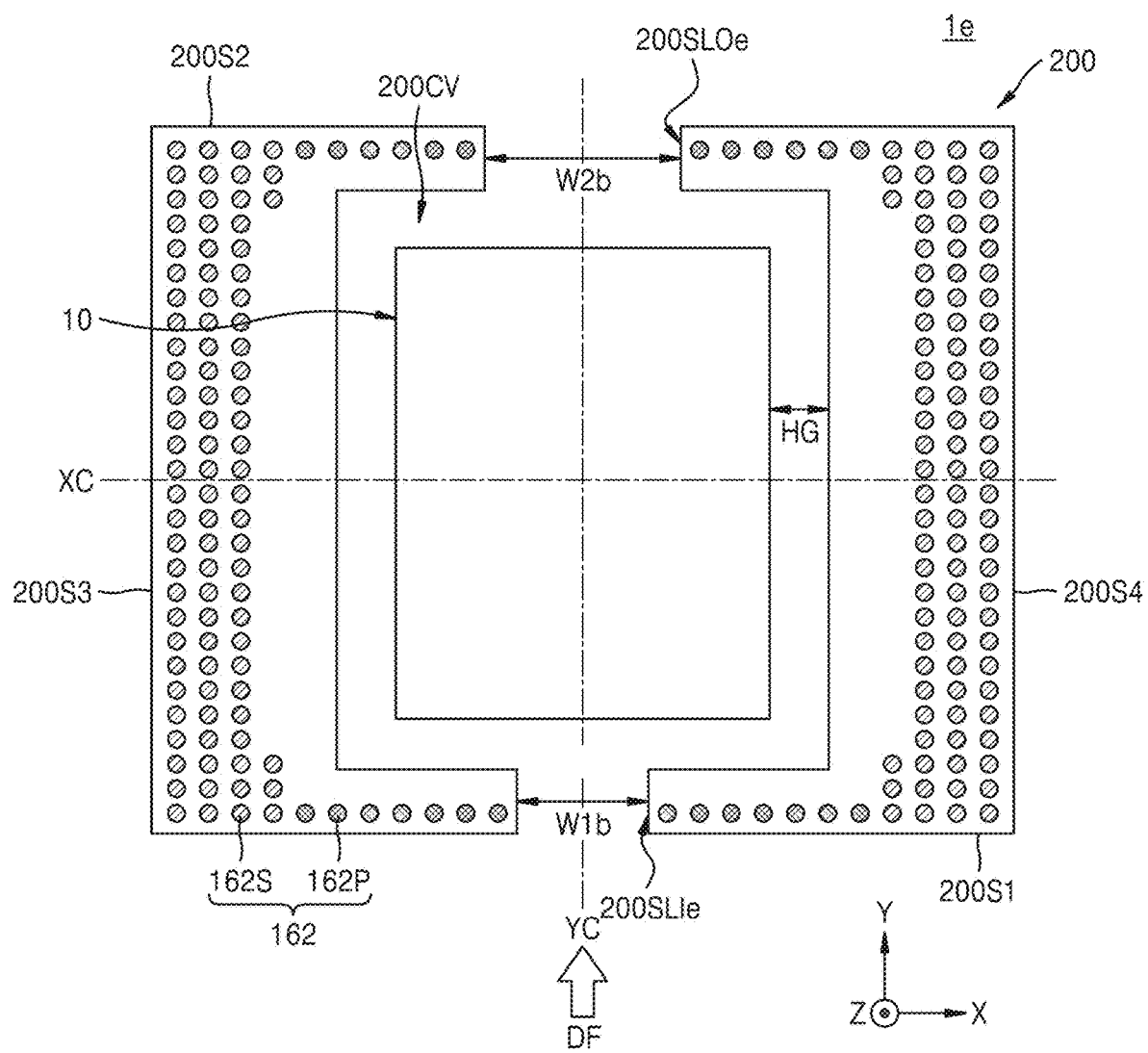

Referring to FIG. 2E, the semiconductor package 1e includes a semiconductor chip 10, a cover wiring structure 200, and a plurality of connection structures 162 electrically connected to the cover wiring structure 200.

The cover wiring structure 200 may include a cavity 200CV, a first slot 200SLIe, and a second slot 200SLOe. The cavity 200CV may be separated from side surfaces 200S1, 200S2, 200S3, and 200S4 of the cover wiring structure 200. The cavity 200CV may have a planar rectangular shape.

A portion of the semiconductor chip 10 may be positioned in the cavity 200CV. The filling member 164 shown in FIGS. 1A and 1B may be filled between the semiconductor chip 10 and the cover wiring structure 200.

The cover wiring structure 200 may include the first slot 200SLIe and the second slot 200SLOe connected to the cavity 200CV and extending to opposite side surfaces of the cover wiring structure 200, respectively. The first slot 200SLIe and the second slot 200SLOe may be the first slot 200SLI and the second slot 200SLO shown in FIG. 1B. In FIG. 2E, the cover wiring structure 200 is illustrated as having one first slot 200SLIe and one second slot 200SLOe connected to the cavity 200CV, but is not limited thereto. For example, the cover wiring structure 200 may include a variable number of first slots 200SLIe and a variable number of second slots 200SLOe, similar to that described with reference to FIGS. 2B, 2C, and 2D.

The first slot 200SLIe may extend from the first side surface 200S1 of the cover wiring structure 200 to the cavity 200CV, and the second slot 200SLOe may extend from the second side surface 200S2 of the cover wiring structure 200 to the cavity 200CV.

Each of the first slot 200SLIe and the second slot 200SLOe may have a bar-shaped planar cross-section extending in the second horizontal direction (Y direction), or a planar cross-section of a rectangular shape having a long axis in the second horizontal direction (Y direction). In the first horizontal direction (X direction), the first slot 200SLIe may have a first width W1b, and the second slot 200SLOe may have a second width W2b. The second width W2b may have a greater value than the first width W1b.

For example, the cover wiring structure 200 may have an asymmetric structure with respect to the first center line XC extending in the first horizontal direction (X direction). For example, the cover wiring structure 200 may have a symmetrical structure with respect to the second center line YC extending in the second horizontal direction (Y direction). That is, the first slot 200SLIe and the second slot 200SLOe may be disposed to be symmetrical with respect to the second center line YC in the cover wiring structure 200.

The first slot 200SLIe and the second slot 200SLOe may not vertically overlap the plurality of connection structures 162. In a plan view, the first slot 200SLIe and the second slot 200SLOe may be positioned to be separated from the plurality of connection structures 162 in the first horizontal direction (X direction). The plurality of connection structures 162 may include a plurality of first connection structures 162S and a plurality of second connection structures 162P. A connection structure 162 adjacent to the first slot 200SLIe and the second slot 200SLOe among the plurality of connection structures 162 may be a second connection structure 162P.

Figure 2F:
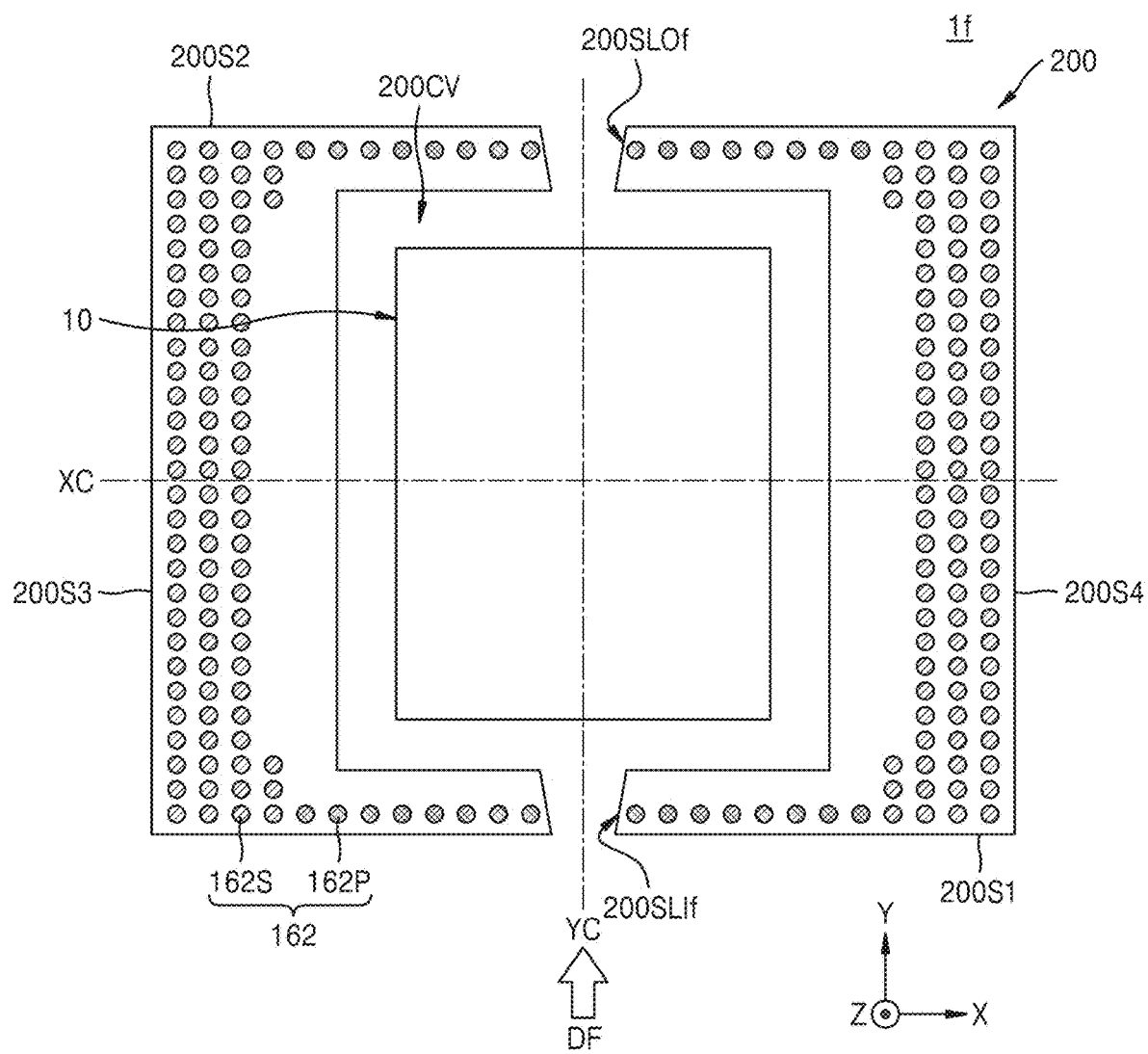

Referring to FIG. 2F, the semiconductor package 1f includes a semiconductor chip 10, a cover wiring structure 200, and a plurality of connection structures 162 electrically connected to the cover wiring structure 200.

The cover wiring structure 200 may have a cavity 200CV, a first slot 200SLIf, and a second slot 200SLOf. The cavity 200CV may be separated from side surfaces 200S1, 200S2, 200S3, and 200S4 of the cover wiring structure 200. The cavity 200CV may have a planar rectangular shape.

A portion of the semiconductor chip 10 may be positioned in the cavity 200CV. The filling member 164 shown in FIGS. 1A and 1B may be filled between the semiconductor chip 10 and the cover wiring structure 200.

The cover wiring structure 200 may include the first slot 200SLIf and the second slot 200SLOf connected to the cavity 200CV and extending to opposite side surfaces of the cover wiring structure 200, respectively. The first slot 200SLIf and the second slot 200SLOf may be the first slot 200SLI and the second slot 200SLO shown in FIG. 1B. In FIG. 2F, the cover wiring structure 200 is illustrated as having one first slot 200SLIf and one second slot 200SLOf connected to the cavity 200CV, but is not limited thereto. For example, the cover wiring structure 200 may include a variable number of first slots 200SLIf and a variable number of second slots 200SLOf similar to that described with reference to FIGS. 2B, 2C, and 2D.

The first slot 200SLIf may extend from the first side surface 200S1 of the cover wiring structure 200 to the cavity 200CV, and the second slot 200SLOf may extend from the second side surface 200S2 of the cover wiring structure 200 to the cavity 200CV.

Each of the first slot 200SLIf and the second slot 200SLOf may have a trapezoidal planar cross-section extending in a direction from the first side surface 200S1 to the second side surface 200S2, that is, in the second horizontal direction (Y direction) with an increasing horizontal width.

For example, the cover wiring structure 200 may have an asymmetric structure with respect to the first center line XC extending in the first horizontal direction (X direction). For example, the cover wiring structure 200 may have a symmetrical structure with respect to the second center line YC extending in the second horizontal direction (Y direction). That is, the first slot 200SLIf and the second slot 200SLOf may be disposed to be symmetrical with respect to the second center line YC in the cover wiring structure 200.

The first slot 200SLIf and the second slot 200SLOf may not vertically overlap the plurality of connection structures 162. In a plan view, the first slot 200SLIf and the second slot 200SLOf may be positioned to be separated from the plurality of connection structures 162 in the first horizontal direction (X direction). The plurality of connection structures 162 may include a plurality of first connection structures 162S and a plurality of second connection structures 162P. A connection structure 162 adjacent to the first slot 200SLIf and the second slot 200SLOf among the plurality of connection structures 162 may be a second connection structure 162P.

Figure 2G:
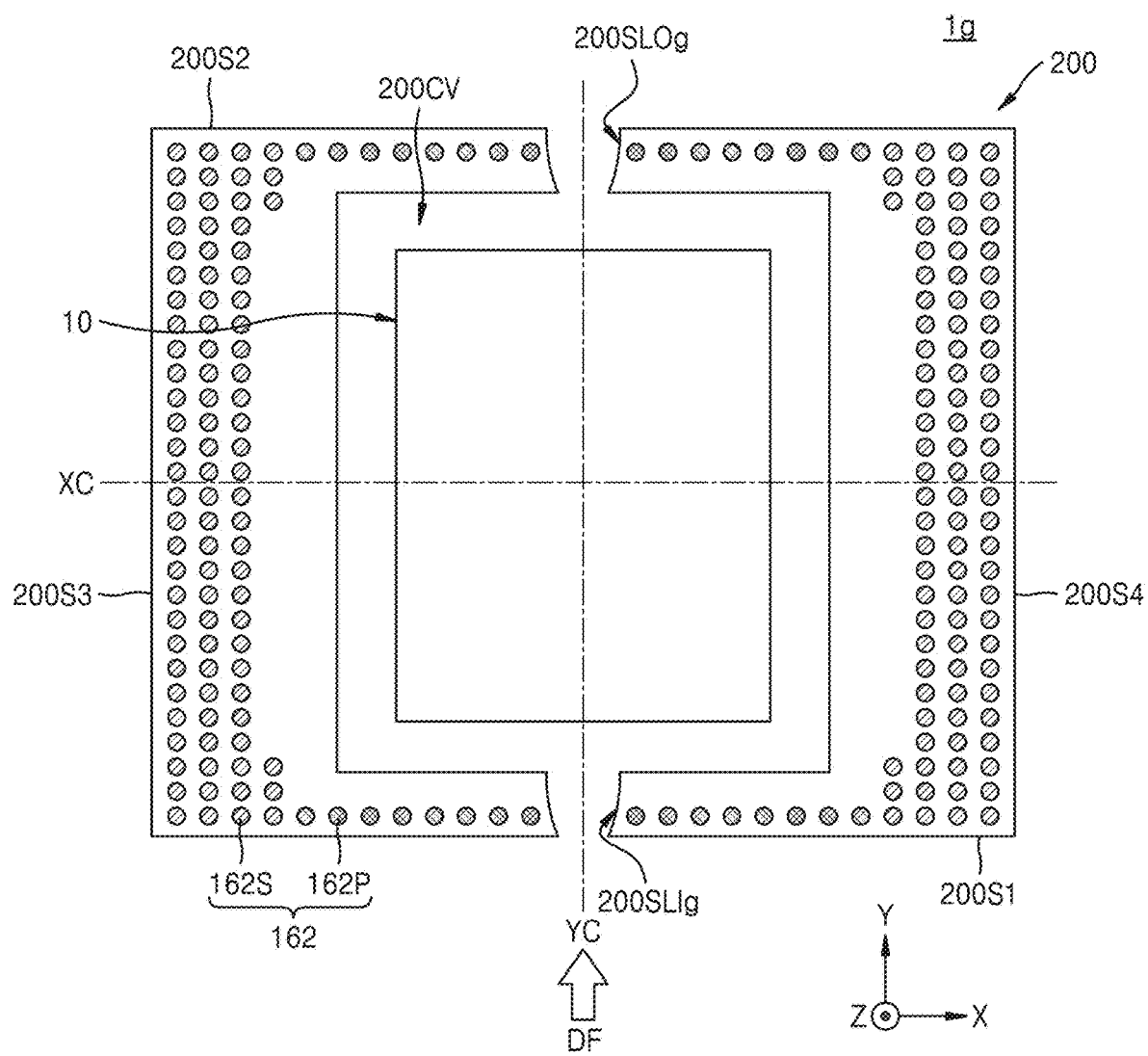

Referring to FIG. 2G, the semiconductor package 1g includes a semiconductor chip 10, a cover wiring structure 200, and a plurality of connection structures 162 electrically connected to the cover wiring structure 200.

The cover wiring structure 200 may include a cavity 200CV, a first slot 200SLIg, and a second slot 200SLOg. The cavity 200CV may be separated from side surfaces 200S1, 200S2, 200S3, and 200S4 of the cover wiring structure 200. The cavity 200CV may have a planar rectangular shape.

A portion of the semiconductor chip 10 may be positioned in the cavity 200CV. The filling member 164 shown in FIGS. 1A and 1B may be filled between the semiconductor chip 10 and the cover wiring structure 200.

The cover wiring structure 200 may include the first slot 200SLIg and the second slot 200SLOg connected to the cavity 200CV and extending to opposite side surfaces of the cover wiring structure 200, respectively. The first slot 200SLIg and the second slot 200SLOg may be the first slot 200SLI and the second slot 200SLO shown in FIG. 1B. In FIG. 2G, the cover wiring structure 200 is illustrated as having one first slot 200SLIg and one second slot 200SLOg connected to the cavity 200CV, but is not limited thereto. For example, the cover wiring structure 200 may have a variable number of first slots 200SLIg and a variable number of second slots 200SLOg similar to that described with reference to FIGS. 2B, 2C, and 2D.

The first slot 200SLIg may extend from the first side surface 200S1 of the cover wiring structure 200 to the cavity 200CV, and the second slot 200SLOg may extend from the second side surface 200S2 of the cover wiring structure 200 to the cavity 200CV.

Each of the first slot 200SLIf and the second slot 200SLOf may have a planar cross-section close to a semicircle shape extending in a direction from the first side surface 200S1 to the second side surface 200S2, that is, in the second horizontal direction (Y direction) and increasing in horizontal width. At edges of the first slot 200SLIf and the second slot 200SLOf, a side surface of the cover wiring structure 200 may have a planarly rounded shape.

For example, the cover wiring structure 200 may have an asymmetric structure with respect to the first center line XC extending in the first horizontal direction (X direction). For example, the cover wiring structure 200 may have a symmetrical structure with respect to the second center line YC extending in the second horizontal direction (Y direction). That is, the first slot 200SLIg and the second slot 200SLOg may be disposed to be symmetrical with respect to the second center line YC in the cover wiring structure 200.

The first slot 200SLIg and the second slot 200SLOg may not vertically overlap the plurality of connection structures 162. In a plan view, the first slot 200SLIg and the second slot 200SLOg may be positioned to be separated from the plurality of connection structures 162 in the first horizontal direction (X direction). The plurality of connection structures 162 may include a plurality of first connection structures 162S and a plurality of second connection structures 162P. A connection structure 162 adjacent to the first slot 200SLIg and the second slot 200SLOg among the plurality of connection structures 162 may be a second connection structure 162P.

Figure 3A:
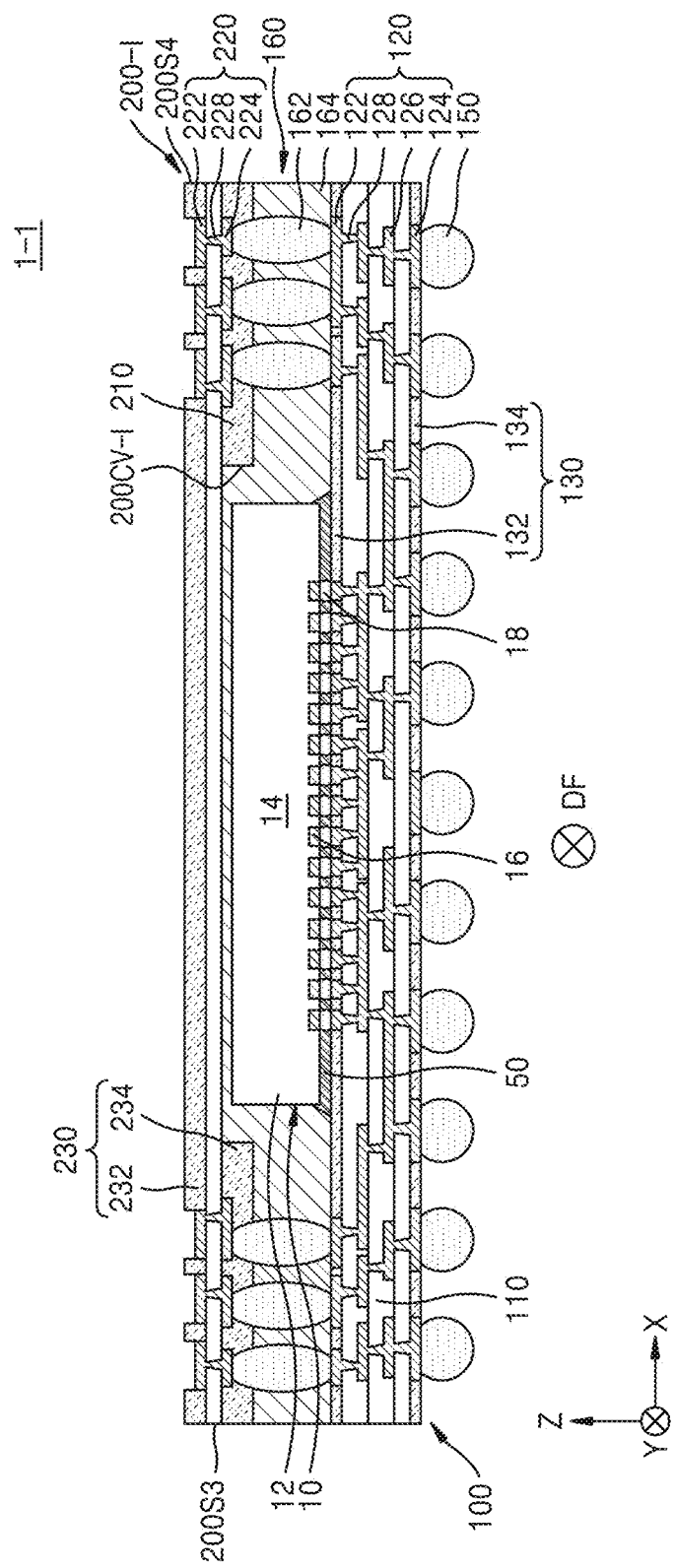
FIGS. 3A and 3B are cross-sectional views illustrating a semiconductor package according to the inventive concepts.
Figure 3B:
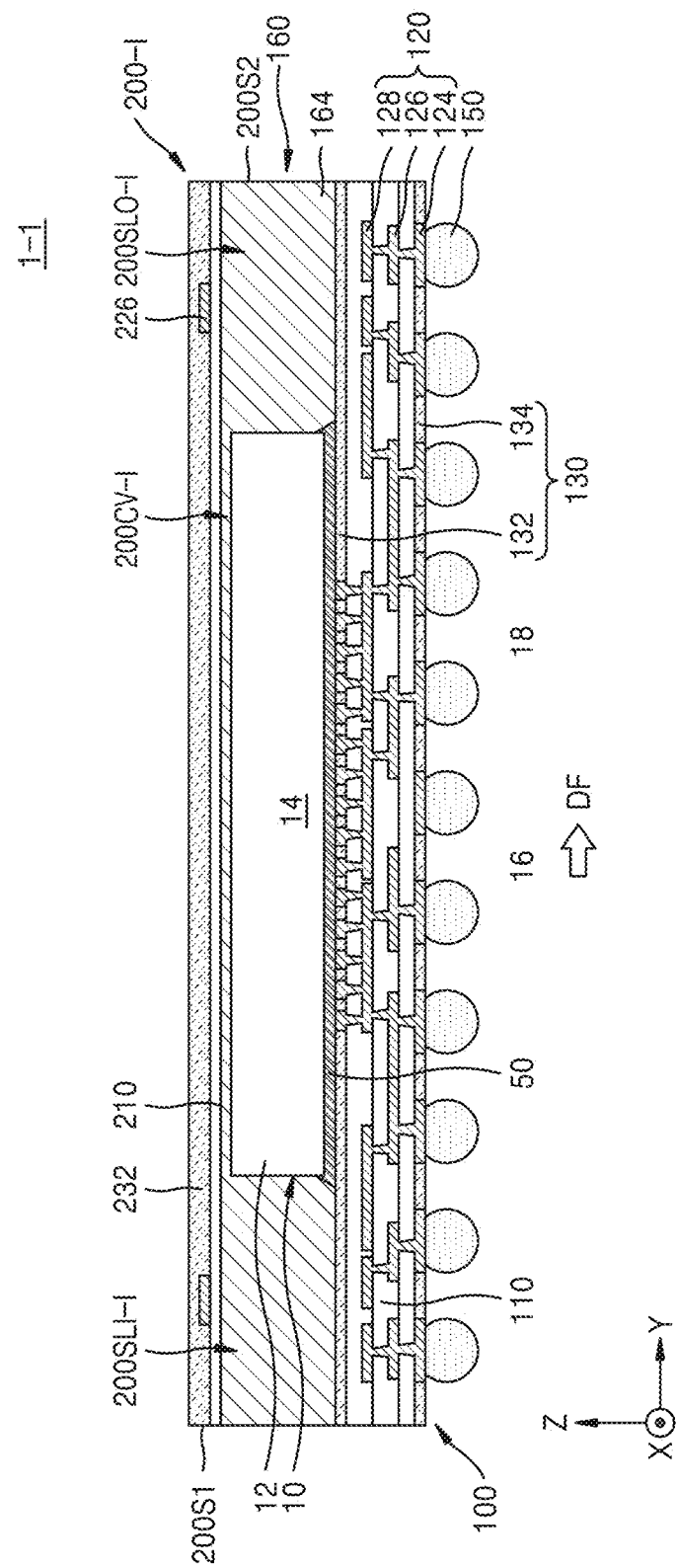

FIGS. 3A and 3B are example cross-sectional views illustrating a semiconductor package 1-1 according to the inventive concepts. Specifically, FIGS. 3A and 3B are cross-sectional views of a semiconductor package taken along a direction orthogonal to each other. For example, FIG. 3A is a cross-sectional view taken along a first horizontal direction (X direction), and FIG. 3B is a cross-sectional view taken along a second horizontal direction (Y direction). Among the descriptions of FIGS. 3A and 3B, descriptions already given with reference to FIGS. 1A to 2G may be omitted.

Referring to FIGS. 3A and 3B together, the semiconductor package 1-1 may include a support wiring structure 100, an expanded layer 160 on the support wiring structure 100, a semiconductor chip 10 disposed in the expanded layer 160, and a cover wiring structure 200-I disposed on the expanded layer 160.

In some example embodiments, the cover wiring structure 200-I may be a multi-layer printed circuit board. The cover wiring structure 200-I may include a second base insulating layer 210 and a plurality of second wiring patterns 220. The cover wiring structure 200-I may include a first side surface 200S1 and a second side surface 200S2 opposite to each other in a second horizontal direction (Y direction), and a third side surface 200S3 and the fourth side surface 200S4 opposite to each other in the first horizontal direction (X direction). The cover wiring structure 200-I may further include a second solder resist layer 230 including a second upper surface solder resist layer 232 and a second lower surface solder resist layer 234.

In a plan view, the cover wiring structure 200-I may have a cavity 200CV-I extending from a lower surface of the cover wiring structure 200-I to the inside of the cover wiring structure 200-I near the center. The cavity 200CV-I may be separated from the first to fourth side surfaces 200S1, 200S2, 200S3, and 200S4 of the cover wiring structure 200-I. The cavity 200CV-I may have a planar rectangular shape. An upper portion of the semiconductor chip 10 may be positioned in the cavity 200CV-I. A filling member 164 may be filled between the semiconductor chip 10 and the cover wiring structure 200-I.

The cover wiring structure 200-I may include a first slot 200SLI-I and a second slot 200SLO-I connected to the cavity 200CV-I and extending to opposite side surfaces of the cover wiring structure 200-I, respectively. The first slot 200SLI-I may extend from the first side surface 200S1 of the cover wiring structure 200-I to the cavity 200CV-I, and the second slot 200SLO-I may extend from the second side surface 200S2 of the cover wiring structure 200-I to the cavity 200CV-I.

The planar cross-section, arrangement, and number of the first slot 200SLI-I and the second slot 200SLO-I may be the same as the planar cross-section, arrangement, and number of the first slots 200SLIa, 200SLIb, 200SLIc, 200SLId, 200SLIe, 200SLIf, 200SLIg and the second slots 200SLOa, 200SLOb, 200SLOc, 200SLOd, 200SLOe, 200SLOf, and 200SLOg described with reference to FIGS. 2A to 2G.

The filling member 164 may be formed by being injected between the support wiring structure 100 and the cover wiring structure 200-I. The filling member 164 may fill the cavity 200CV-I, the first slot 200SLI-I, and the second slot 200SLO-I between the support wiring structure 100 and the cover wiring structure 200-I.

The cavity 200CV-I, the first slot 200SLI-I, and the second slot 200SLO-I each may have the same depth from a lowermost surface of the cover wiring structure 200-I and may extend into the cover wiring structure 200-I.

Each of the cavity 200CV-I, the first slot 200SLI-I, and the second slot 200SLO-I may penetrate through the second lower surface solder resist layer 234, but may not extend into the second base insulating layer 210. For example, a depth of each of the cavity 200CV-I, the first slot 200SLI-I, and the second slot 200SLO-I may have substantially the same value as a thickness of the second lower surface solder resist layer 234. That is, each of the cavity 200CV-I, the first slot 200SLI-I, and the second slot 200SLO-I may be formed to be defined by the second lower surface solder resist layer 234.

Figure 4A:
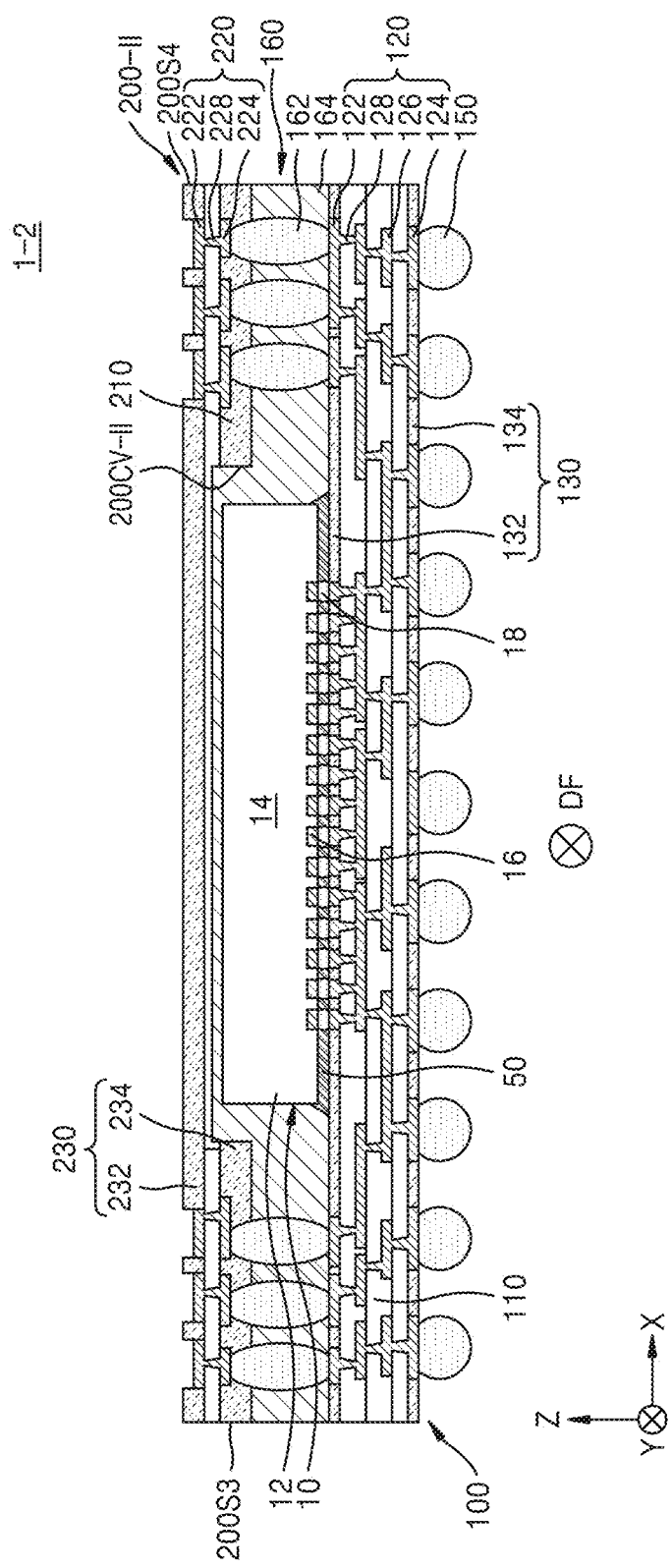
FIGS. 4A and 4B are cross-sectional views illustrating a semiconductor package according to the inventive concepts.
Figure 4B:
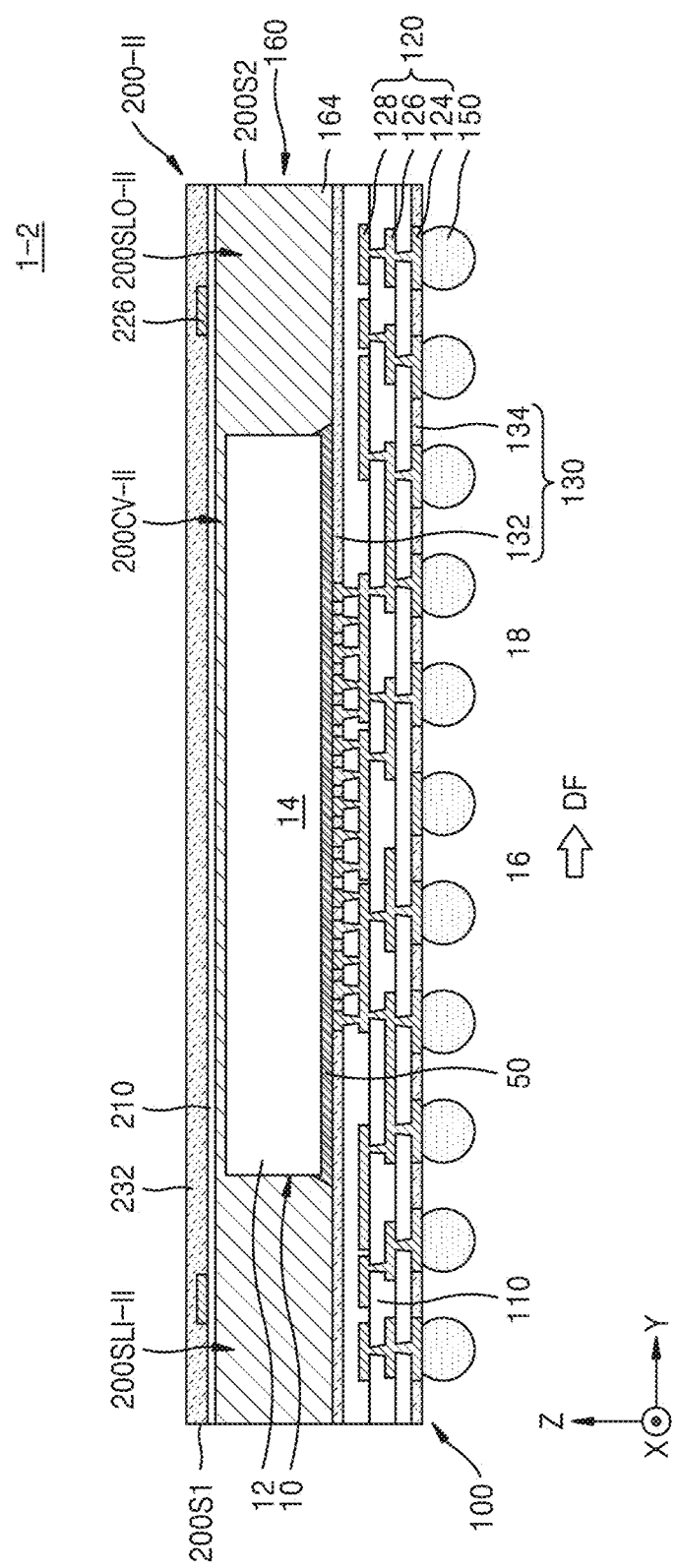

FIGS. 4A and 4B are cross-sectional views illustrating a semiconductor package 1-2 according to the inventive concepts. Specifically, FIGS. 4A and 4B are cross-sectional views of a semiconductor package 1-2 taken along a direction orthogonal to each other. For example, FIG. 4A is a cross-sectional view taken along a first horizontal direction (X direction), and FIG. 4B is a cross-sectional view taken along a second horizontal direction (Y direction). Among the descriptions of FIGS. 4A and 4B, descriptions already given with reference to FIGS. 1A to 3B may be omitted.

Referring to FIGS. 4A and 4B together, the semiconductor package 1-2 may include a support wiring structure 100, an expanded layer 160 on the support wiring structure 100, and a semiconductor chip 10 disposed in the expanded layer 160, and a cover wiring structure 200—II disposed on the expanded layer 160.

In some example embodiments, the cover wiring structure 200—II may be a multi-layer printed circuit board. The cover wiring structure 200—II may include a second base insulating layer 210 and a plurality of second wiring patterns 220. The cover wiring structure 200—II may include a first side surface 200S1 and a second side surface 200S2 opposite to each other in a second horizontal direction (Y direction), and a third side surface 200S3 and a fourth side surface 200S4 opposite to each other in a first horizontal direction (X direction). The cover wiring structure 200—II may further include a second solder resist layer 230 including a second upper surface solder resist layer 232 and a second lower surface solder resist layer 234.

In a plan view, the cover wiring structure 200—II may have a cavity 200CV—II extending from a lower surface of the cover wiring structure 200—II to an inside of the cover wiring structure 200—II near the center. The cavity 200CV—II may be separated from the first to fourth side surfaces 200S1, 200S2, 200S3, and 200S4 of the cover wiring structure 200—II. The cavity 200CV—II may have a planar rectangular shape. An upper portion of the semiconductor chip 10 may be positioned in the cavity 200CV—II. A filling member 164 may be filled between the semiconductor chip 10 and the cover wiring structure 200—II.

The cover wiring structure 200—II may include a first slot 200SLI—II and a second slot 200SLO—II connected to the cavity 200CV—II and extending to opposite side surfaces of the cover wiring structure 200—II, respectively. The first slot 200SLI—II may extend from the first side surface 200S1 of the cover wiring structure 200—II to the cavity 200CV—II, and the second slot 200SLO—II may extend from the second side surface 200S2 of the cover wiring structure 200—II to the cavity 200CV—II.

The filling member 164 may be formed by being injected between the support wiring structure 100 and the cover wiring structure 200—II. The filling member 164 may fill the cavity 200CV—II, the first slot 200SLI—II, and the second slot 200SLO—II between the support wiring structure 100 and the cover wiring structure 200—II.

The cavity 200CV—II, the first slot 200SLI—II, and the second slot 200SLO—II each have the same depth from a lowermost surface of the cover wiring structure 200—II and may extend into the cover wiring structure 200—II.

Each of the cavity 200CV—II, the first slot 200SLI—II, and the second slot 200SLO—II may penetrate through the second lower surface solder resist layer 234, but may not extend into the second base insulating layer 210. For example, a depth of each of the cavity 200CV—II, the first slot 200SLI—II, and the second slot 200SLO—II may have a greater value than a thickness of the second lower surface solder resist layer 234. Each of the cavity 200CV—II, the first slot 200SLI—II, and the second slot 200SLO—II may pass through the second lower surface solder resist layer 234 and extend into the second base insulating layer 210, but may not penetrate through the second base insulating layer 210.

Figure 5:
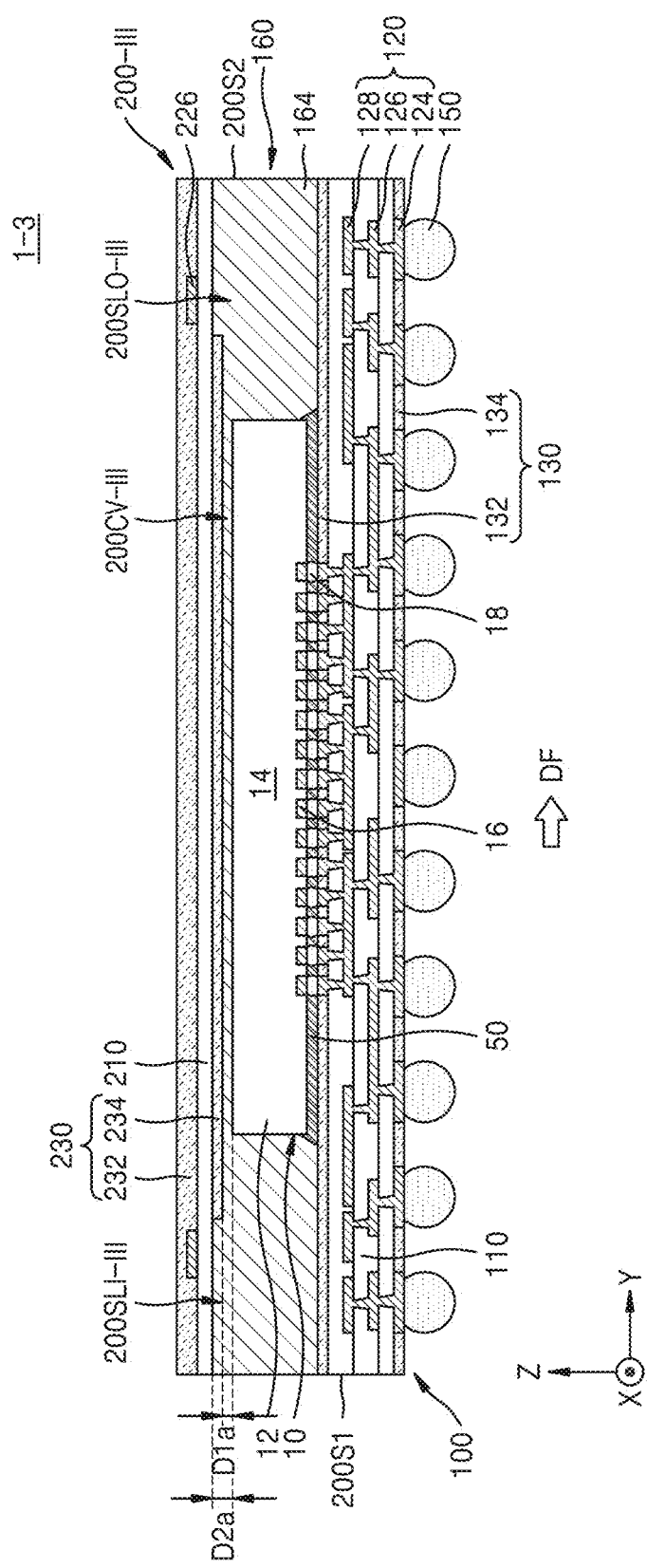
FIG. 5 is a cross-sectional view illustrating a semiconductor package according to the inventive concepts.

FIG. 5 is a cross-sectional view illustrating a semiconductor package 1-3 according to the inventive concept. Specifically, FIG. 5 is a cross-sectional view taken along the same direction as FIGS. 1B, 3B, and 4B. For example, FIG. 5 is a cross-sectional view taken along a second horizontal direction (Y direction). Among the descriptions of FIG. 5, descriptions already given with reference to FIGS. 1A to 4B may be omitted.

Referring to FIG. 5, the semiconductor package 1-3 includes a support wiring structure 100, an expanded layer 160 on the support wiring structure 100, a semiconductor chip 10 disposed in the expanded layer 160, and a cover wiring structure 200—III disposed on the expanded layer 160.

In some example embodiments, the cover wiring structure 200—III may be a multi-layer printed circuit board. The cover wiring structure 200—III may include a second base insulating layer 210 and a plurality of second wiring patterns 220. The cover wiring structure 200—III may include a first side surface 200S1 and a second side surface 200S2 opposite to each other in a second horizontal direction (Y direction). The cover wiring structure 200—III may further include a second solder resist layer 230 including a second upper surface solder resist layer 232 and a second lower surface solder resist layer 234.

In a plan view, the cover wiring structure 200—III may include a cavity 200CV—III extending from a lower surface of the cover wiring structure 200—III to an inside of the cover wiring structure 200—III near the center. The cavity 200CV—III may have a planar rectangular shape. An upper portion of the semiconductor chip 10 may be positioned in the cavity 200CV—III. A filling member 164 may be filled between the semiconductor chip 10 and the cover wiring structure 200—III.

The cover wiring structure 200—III may include a first slot 200SLI—III and a second slot 200SLO—III connected to the cavity 200CV—III and extending to opposite sides of the cover wiring structure 200—III, respectively. The first slot 200SLI—III may extend from the first side surface 200S1 of the cover wiring structure 200—III to the cavity 200CV—III, and the second slot 200SLO—III may extend from the second side surface 200S2 of the cover wiring structure 200—III to the cavity 200CV—III.

The filling member 164 may be formed by being injected between the support wiring structure 100 and the cover wiring structure 200—III. The filling member 164 may fill the cavity 200CV—III, the first slot 200SLI—III, and the second slot 200SLO—III between the support wiring structure 100 and the cover wiring structure 200—III.

The cavity 200CV—III may have a first depth Dla from a lowermost surface of the cover wiring structure 200—III and may extend into the cover wiring structure 200—III, and each of the first slot 200SLI—III and the second slot 200SLO—III may have a second depth D2a from the lowermost surface of the cover wiring structure 200—III and extend into the cover wiring structure 200—III. The second depth D2a may be greater than the first depth Dla. For example, the first depth Dla may have a value less than a thickness of the second lower surface solder resist layer 234, and the second depth D2a may have a value substantially equal to the thickness of the second lower surface solder resist layer 234.

In some example embodiments, the cavity 200CV—III may extend from a lower surface of the second lower surface solder resist layer 234 into the second lower surface solder resist layer 234, but may not extend to the second base insulating layer 210, and each of the first slot 200SLI—III and the second slot 200SLO—III may penetrate through the second lower surface solder resist layer 234.

Figure 6:
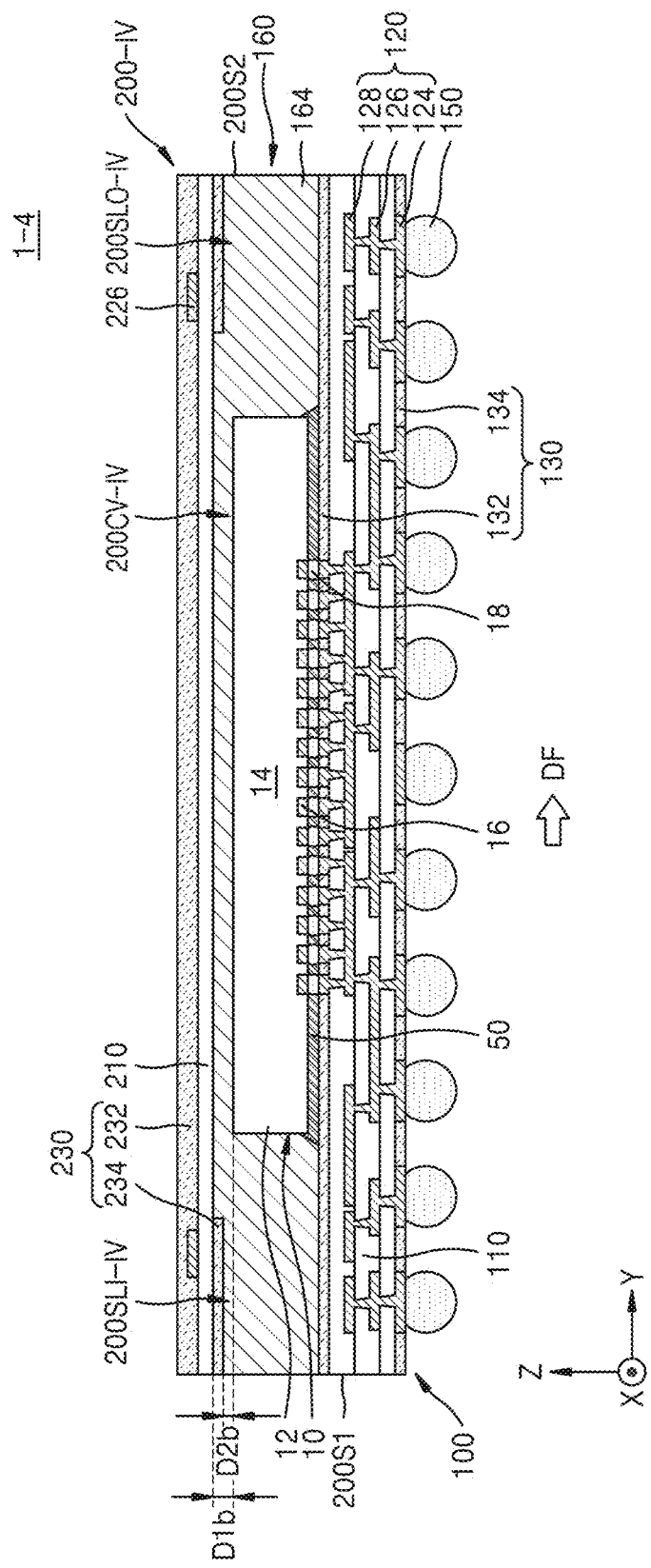
FIG. 6 is a cross-sectional view illustrating a semiconductor package according to the inventive concepts.

FIG. 6 is a cross-sectional view illustrating a semiconductor package 1-4 according to the inventive concepts. Specifically, FIG. 6 is a cross-sectional view taken along the same direction as FIGS. 1B, 3B, 4B, and 5. For example, FIG. 6 is a cross-sectional view taken along a second horizontal direction (Y direction). Among the descriptions of FIG. 6, descriptions already given with reference to FIGS. 1A to 5 may be omitted.

Referring to FIG. 6, the semiconductor package 1-4 may include a support wiring structure 100, an expanded layer 160 on the support wiring structure 100, a semiconductor chip 10 disposed in the expanded layer 160, and a cover wiring structure 200-IV disposed on the expanded layer 160.

In some example embodiments, the cover wiring structure 200-IV may be a multi-layer printed circuit board. The cover wiring structure 200-IV may include a second base insulating layer 210 and a plurality of second wiring patterns 220. The cover wiring structure 200-IV may include a first side surface 200S1 and a second side surface 200S2 opposite to each other in the second horizontal direction (Y direction). The cover wiring structure 200-IV may further include a second solder resist layer 230 including a second upper surface solder resist layer 232 and a second lower surface solder resist layer 234.

In a plan view, the cover wiring structure 200-IV may include a cavity 200CV-IV extending from a lower surface of the cover wiring structure 200-IV to an inside of the cover wiring structure 200-IV near the center. The cavity 200CV-IV may have a planar rectangular shape. An upper portion of the semiconductor chip 10 may be positioned in the cavity 200CV-IV. A filling member 164 may be filled between the semiconductor chip 10 and the cover wiring structure 200-IV.

The cover wiring structure 200-IV may include a first slot 200SLI-IV and a second slot 200SLO-IV connected to the cavity 200CV-IV and extending to opposite sides of the cover wiring structure 200-IV, respectively. The first slot 200SLI-IV may extend from the first side surface 20051 of the cover wiring structure 200-IV to the cavity 200CV-IV, and the second slot 200SLO-IV may extend from the second side surface 200S2 of the cover wiring structure 200-IV to the cavity 200CV-IV.

The filling member 164 may be formed by being injected between the support wiring structure 100 and the cover wiring structure 200-IV. The filling member 164 may fill the cavity 200CV-IV, the first slot 200SLI-IV, and the second slot 200SLO-IV between the support wiring structure 100 and the cover wiring structure 200-IV.

The cavity 200CV-IV may have a first depth D1b from a lowermost surface of the cover wiring structure 200-IV and may extend into the cover wiring structure 200-IV, and each of the first slot 200SLI-IV and the second slots 200SLO-IV may have a second depth D2b from the lowermost surface of the cover wiring structure 200-IV and may extend into the cover wiring structure 200-IV. The first depth D1b may be greater than the second depth D2b. For example, the first depth D1b may have generally the same value as a thickness of the second lower surface solder resist layer 234, and the second depth D2b may have a value less than the thickness of the second lower surface solder resist layer 234.

Figure 7A:
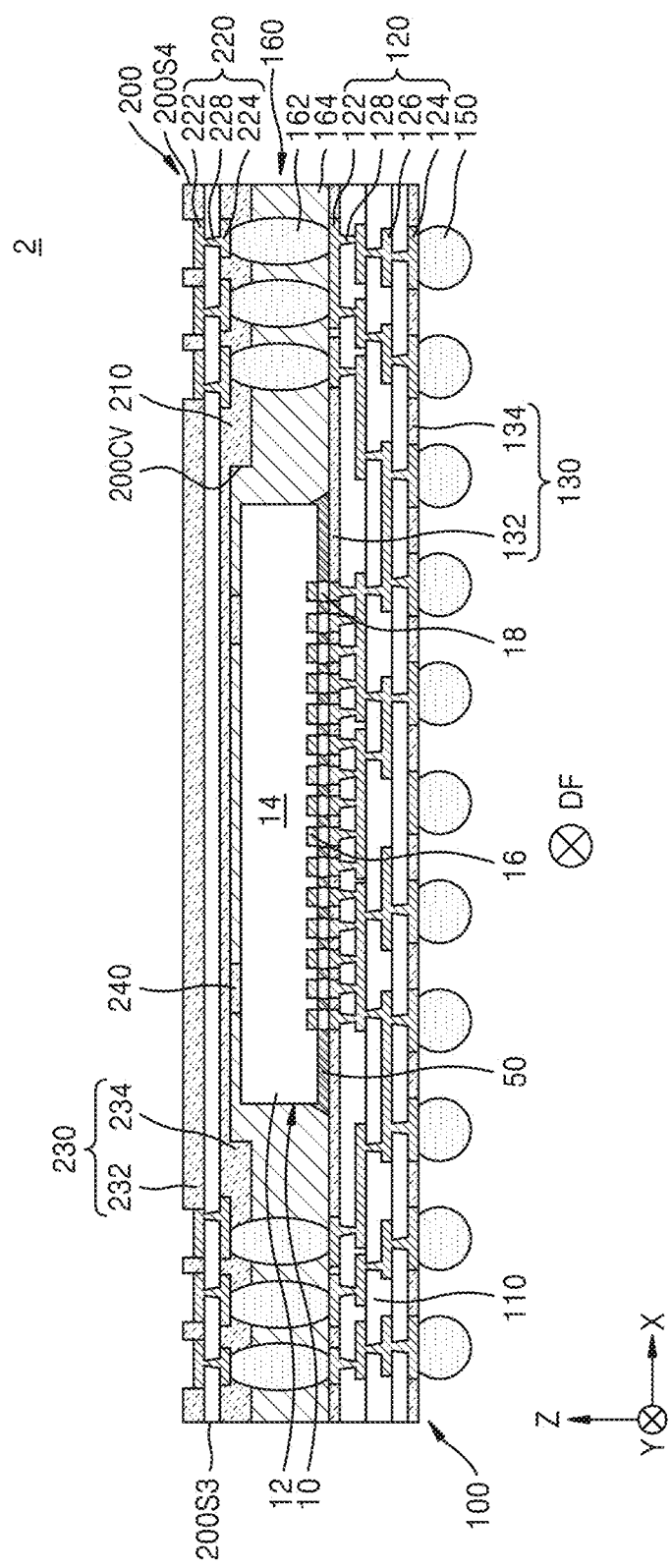
FIGS. 7A and 7B are cross-sectional views illustrating a semiconductor package according to the inventive concepts.
Figure 7B:
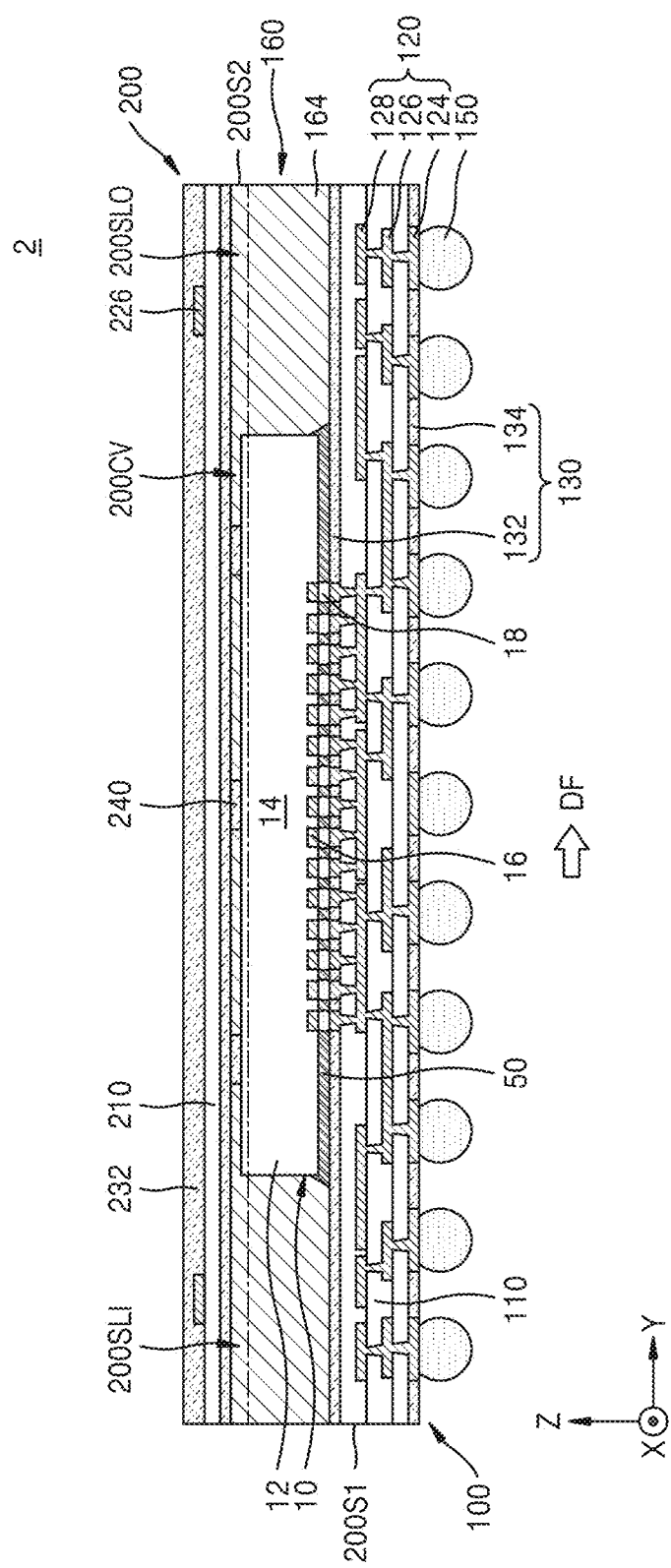

FIGS. 7A and 7B are cross-sectional views illustrating a semiconductor package 2 according to the inventive concepts. Specifically, FIGS. 7A and 7B are cross-sectional views of a semiconductor package 2 taken along a direction orthogonal to each other. For example, FIG. 7A is a cross-sectional view taken along a first horizontal direction (X direction), and FIG. 7B is a cross-sectional view taken along a second horizontal direction (Y direction). Among the descriptions of FIGS. 7A and 7B, descriptions already given with reference to FIGS. 1A to 6 may be omitted.

Referring to FIGS. 7A and 7B together, the semiconductor package 2 includes a support wiring structure 100, an expanded layer 160 on the support wiring structure 100, a semiconductor chip 10 disposed in the expanded layer 160, and a cover wiring structure 200 disposed on the expanded layer 160.

The cover wiring structure 200 may further include a plurality of solder resist patches 240 disposed on a lower surface of the cover wiring structure 200. In some embodiments, the plurality of solder resist patches 240 may have a circular or quadrangular horizontal cross-section. The plurality of solder resist patches 240 may be disposed in a cavity 200CV. The plurality of solder resist patches 240 may be separated from each other in the cavity 200CV and disposed in a row.

The plurality of solder resist patches 240 may be disposed to be in contact with an inactive surface, that is, an upper surface of the semiconductor chip 10. The plurality of solder resist patches 240 may be disposed between the second lower surface solder resist layer 234 and the semiconductor chip 10 to maintain a gap between the cover wiring structure 200 and the semiconductor chip 10.

Figure 8A:
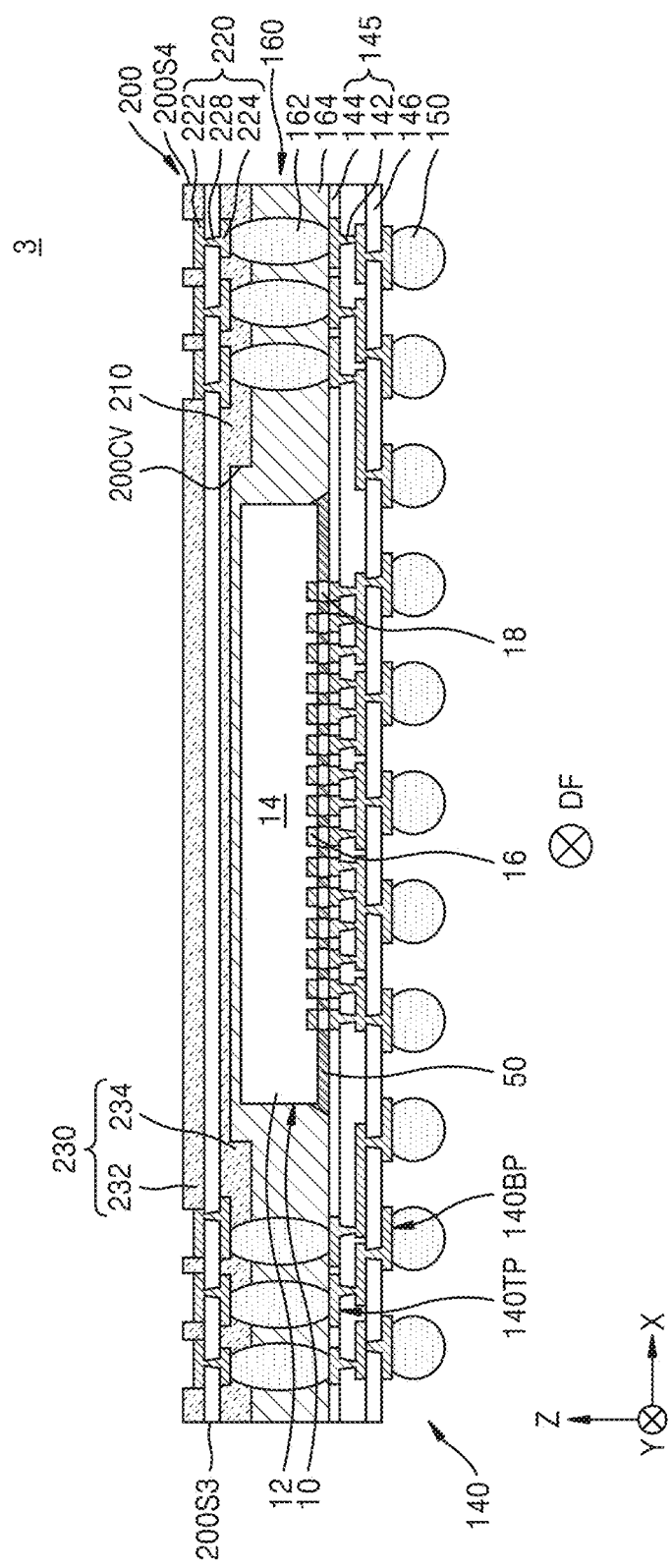
FIGS. 8A and 8B are cross-sectional views illustrating a semiconductor package according to the inventive concepts.
Figure 8B:
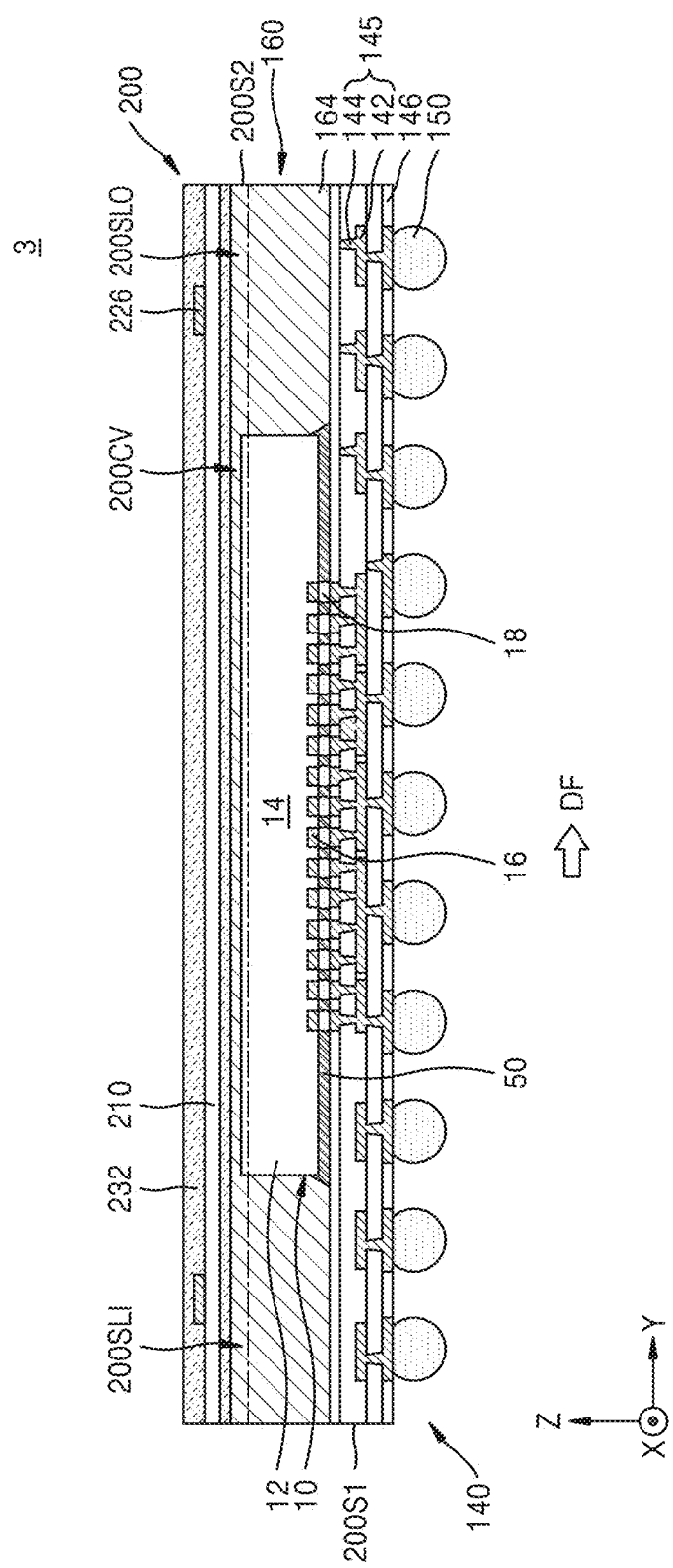

FIGS. 8A and 8B are cross-sectional views illustrating a semiconductor package 3 according to the inventive concepts. Specifically, FIGS. 8A and 8B are cross-sectional views of a semiconductor package 3 taken along a direction orthogonal to each other. For example, FIG. 8A is a cross-sectional view taken along a first horizontal direction (X direction), and FIG. 8B is a cross-sectional view taken along a second horizontal direction (Y direction). Among the descriptions of FIGS. 8A and 8B, descriptions already given with reference to FIGS. 1A to 7B may be omitted.

Referring to FIGS. 8A and 8B together, the semiconductor package 3 includes a support wiring structure 140, an expanded layer 160 on the support wiring structure 140, a semiconductor chip 10 disposed in the expanded layer 160, and a cover wiring structure 200 disposed on the expanded layer 160. The support wiring structure 140 may be referred to as a redistribution layer.

The support wiring structure 140 may include a redistribution conductive structure 145 and a plurality of redistribution insulating layers 146. Each of the redistribution conductive structure 145 and the redistribution insulating layers 146 may be referred to as a first wiring pattern and a first base insulating layer, respectively. The redistribution conductive structure 145 may include a plurality of redistribution line patterns 142 disposed on at least one surface of an upper surface and a lower surface of each of the plurality of redistribution insulating layers 146, and a plurality of redistribution vias 144 that pass through at least one redistribution insulating layer 146 of the plurality of redistribution insulating layers 146 to be respectively connected in a contact manner to some of the plurality of redistribution line patterns 142. In some embodiments, at least a portion of the plurality of redistribution line patterns 142 may be formed together with a portion of the plurality of redistribution vias 144 to form an integral body. For example, the redistribution vias 144 on the redistribution line pattern 142 may be formed together with the redistribution line pattern 142 to form an integral body. In some embodiments, the plurality of redistribution vias 144 may have a tapered shape extending from a lower side to an upper side while a horizontal width is reduced. That is, the plurality of redistribution vias 144 may increase in horizontal width as they move away from the semiconductor chip 10.

A plurality of chip connection pads 16 of the semiconductor chip 10 may be electrically connected to the redistribution conductive structure 145. In some example embodiments, a plurality of chip connection terminals 18 may be disposed between a portion of the redistribution line pattern 142 disposed on the uppermost wiring layer among the plurality of redistribution line patterns 142 and the plurality of chip connection pads 16 to electrically connect the semiconductor chip 10 and the redistribution conductive structure 145 of the support wiring structure 140.

Figure 9:
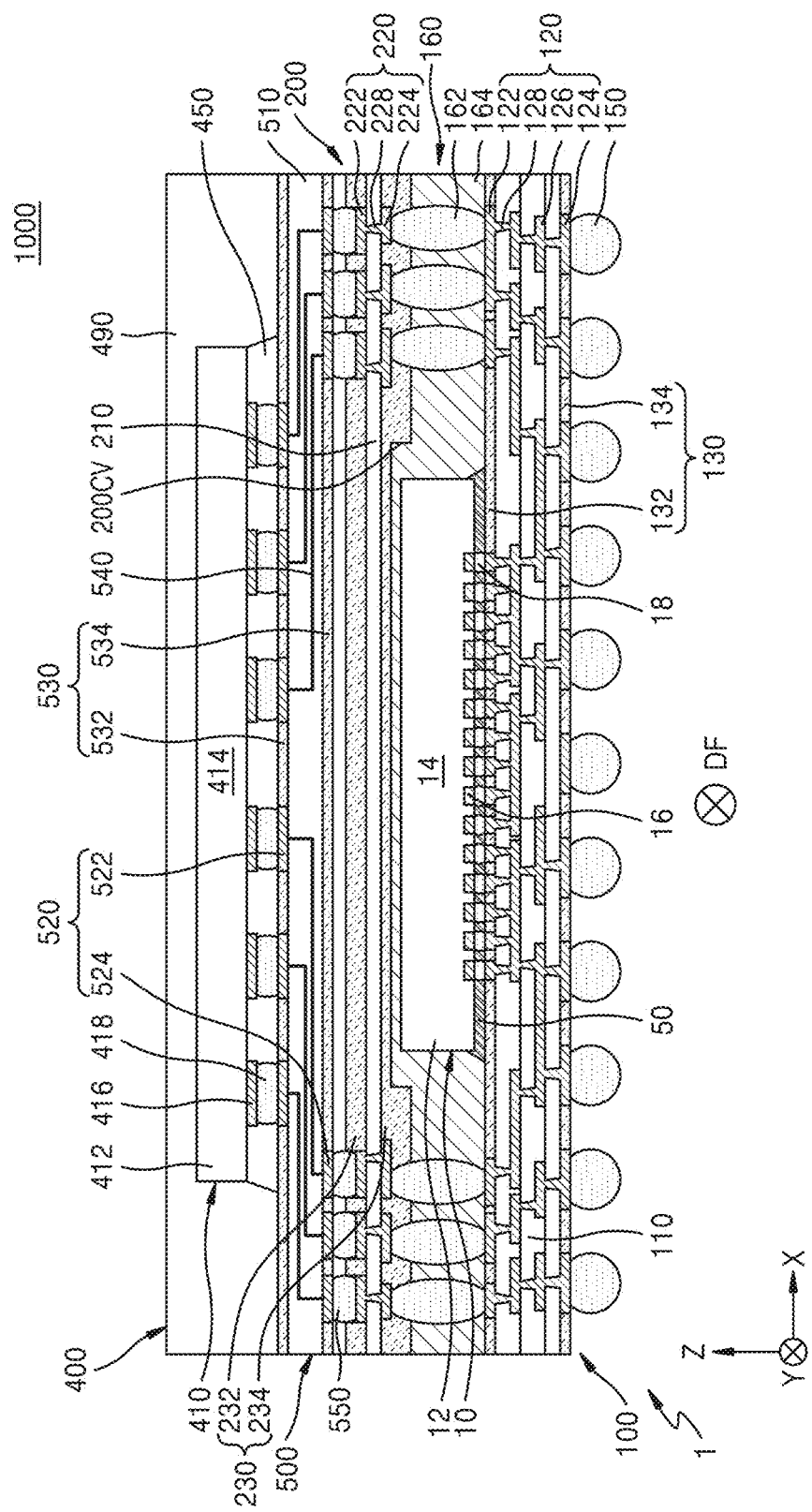
FIG. 9 is a cross-sectional view of a package on package (PoP) type semiconductor package according to the inventive concepts.

FIG. 9 is a cross-sectional view of a package on package (PoP) type semiconductor package 1000 according to the inventive concepts.

Referring to FIG. 9, the package-on-package 1000 includes a second semiconductor package 400 stacked on the first semiconductor package 1. The first semiconductor package 1 may be a lower semiconductor package, and the second semiconductor package 400 may be an upper semiconductor package. In FIG. 9, although the first semiconductor package 1 is shown as substantially the same as the semiconductor package 1 shown in FIGS. 1A and 1, the first semiconductor package 1 may be the semiconductor packages 1a, 1b, 1c, 1d, 1e, 1f, 1g, 2, and 3 described with reference to FIGS. 2A to 8B. The first semiconductor package 1 may include a first semiconductor chip 10, a first semiconductor substrate 12, a first semiconductor device 14, a first chip connection pad 16, a first chip connection terminal 18, and a first underfill layer 50. Each of the first semiconductor chip 10, the first semiconductor substrate 12, the first semiconductor device 14, the first chip connection pad 16, the first chip connection terminal 18, and the first underfill layer 50 may be substantially the same as the semiconductor chip 10, the semiconductor substrate 12, the semiconductor device 14, the chip connection pad 16, the chip connection terminal 18, and the underfill layer 50 described with reference to FIGS. 1A and 1, respectively.

The second semiconductor package 400 may include at least one second semiconductor chip 410. The second semiconductor package 400 may be electrically connected to the first semiconductor package 1 through a plurality of package connection terminals 550 attached to the plurality of second upper surface pads 222 of the first semiconductor package 1.

The second semiconductor chip 410 may include a second semiconductor substrate 412 on which a second semiconductor device 414 is formed on an active surface thereof, and a plurality of second chip connection pads 416 on the active surface of the second semiconductor substrate 412. Because the second semiconductor substrate 412, the second semiconductor device 414, and the second chip connection pad 416 respectively are generally similar to the semiconductor substrate 12, the semiconductor device 14, and the chip connection pad 16 described with reference to FIGS. 1A and 1i, detailed descriptions thereof will be omitted.

The at least one second semiconductor chip 410 may be a memory semiconductor chip. The second semiconductor chip 410 may be, for example, a dynamic random access memory (DRAM) chip, a static random access memory (SRAM) chip, a flash memory chip, an electrically erasable programmable read-only memory (EEPROM) chip, a phase change RAM (PRAM) chip, a magnetic RAM (MRAM) chip, or an analog random access memory (ARAM) chip.

In FIG. 9, it is depicted that at least one second semiconductor chip 410 included in the second semiconductor package 400 is mounted on the package base substrate 500 in a flip-chip manner, but this is not limited thereto. The package-on-package 1000 may include at least one second semiconductor chip 410 and an upper semiconductor package. In order to be electrically connected to the first semiconductor package 1, the upper semiconductor package may be any type of semiconductor package to which the package connection terminal 550 may be attached to a lower side thereof.

The package base substrate 500 may include a base board layer 510 and a plurality of board pads 520 disposed on upper and lower surfaces of the base board layer 510. The plurality of board pads 520 may include a plurality of board upper surface pads 522 disposed on the upper surface of the base board layer 510 and a plurality of board lower surface pads 524 disposed on the lower surface of the base board layer 510. In some embodiments, the package base substrate 500 may be a printed circuit board. For example, the package base board 500 may be a multi-layer printed circuit board. The base board layer 510 may include at least one material selected from phenol resin, epoxy resin, and polyimide.

A board solder resist layer 530 exposing the plurality of board pads 520 may be formed on the upper and lower surfaces of the base board layer 510. The board solder resist layer 530 may include an upper board solder resist layer 532 covering the upper surface of the base board layer 510 and exposing the plurality of board upper surface pads 522 and a lower board solder resist layer 534 covering the lower surface of the base board layer 510 and exposing a plurality of board lower surface pads 524.

The package base substrate 500 may include a board wiring 540 electrically connecting the plurality of board upper surface pads 522 to the plurality of board lower surface pads 524 inside the base board layer 510. The board wiring 540 may include a board wiring line and a board wiring via. The board wiring 540 include copper, nickel, stainless steel, or beryllium copper. In some example embodiments, the board wiring 540 may be disposed between the upper surface of the base board layer 510 and the upper board solder resist layer 532, and/or between the lower surface of the base board layer 510 and the lower board solder resist layer 534.

The plurality of board upper surface pads 522 may be electrically connected to the second semiconductor chip 410. For example, a plurality of second chip connection terminals 418 may be disposed between the plurality of second chip connection pads 416 of the second semiconductor chip 410 and the plurality of board upper surface pads 522 of the package base substrate 500 to electrically connect the second semiconductor chip 410 and the package base substrate 500. In some embodiments, a second underfill layer 450 surrounding the plurality of second chip connection terminals 418 may be interposed between the second semiconductor chip 410 and the package base substrate 500. The second underfill layer 450 may include, for example, an epoxy resin formed by using a capillary underfill method. In some embodiments, the second underfill layer 450 may be a non-conductive film.

A molding layer 490 surrounding the second semiconductor chip 410 may be disposed on the package base substrate 500. The molding layer 490 may include, for example, an epoxy mold compound (EMC). In some example embodiments, the molding layer 490 may cover a non-active surface of the second semiconductor chip 410. In some other example embodiments, the molding layer 490 may cover a side surface of the second semiconductor chip 410, but may not cover the non-active surface of the second semiconductor chip 410, and a heat dissipation member may be attached to the non-active surface of the second semiconductor chip 410.

The inventive concepts have been described in detail with reference to example embodiments, but the inventive concepts are not limited to the above example embodiments, and various modifications and changes are made by those skilled in the art within the technical spirit and scope of the inventive concepts.

While the inventive concepts have been particularly shown and described with reference to embodiments thereof, it will be understood that various changes in form and details may be made therein without departing from the spirit and scope of the following claims.

What is claimed is:

1. A semiconductor package comprising:
a support wiring structure;
a semiconductor chip on the support wiring structure;
a cover wiring structure on the semiconductor chip;
a filling member filling a space between the support wiring structure and the cover wiring structure; and
a plurality of connection structures,
wherein
the cover wiring structure includes a cavity which extends from a lower surface of the cover wiring structure to inside of the cover wiring structure and in which an upper portion of the semiconductor chip is positioned, and a first slot and a second slot respectively having a first width and a second width in a first horizontal direction, communicating with the cavity, and respectively extending to a first side surface and a second side surface of the cover wiring structure, the first side surface and the second side surface are opposite to each other, in a second horizontal direction orthogonal to the first horizontal direction of the cover wiring structure, wherein
the filling member fills the cavity, the first slot, and the second slot, and
wherein the plurality of connection structures includes
a plurality of first connection structures that pass through the filling member to electrically connect the support wiring structure to the cover wiring structure, the plurality of first connection structures being configured to transmit a data signal or a control signal, and the plurality of first connection structures being along a third side surface and a fourth side surface of the cover wiring structure, wherein the third side surface and the fourth side surface are opposite to each other in the first horizontal direction, and
a plurality of second connection structures along the first side surface and the second side surface of the cover wiring structure, the plurality of second connection structures being configured to transmit power or ground.

2. The semiconductor package of claim 1, wherein the first slot and the second slot are spaced apart from the plurality of connection structures in a vertical direction.

3. The semiconductor package of claim 2, wherein among the plurality of connection structures, a connection structure adjacent to the first slot and the second slot is one of the plurality of second connection structures.

4. The semiconductor package of claim 1, wherein the first width and the second width are equal to each other.

5. The semiconductor package of claim 1, wherein the second width is greater than the first width.

6. The semiconductor package of claim 1, wherein the first slot includes a plurality of first slots and the second slot includes a plurality of second slots a number of the plurality of first slots of the cover wiring structure is equal to a number of the plurality of second slots of the cover wiring structure.

7. The semiconductor package of claim 6, wherein the plurality of first slots and the plurality of second slots are aligned with each other in the second horizontal direction.

8. The semiconductor package of claim 1, wherein the second slot includes a plurality of second slots and the first slot includes one or more first slots, a number of the plurality of second slots of the cover wiring structure is greater than a number of the one or more first slots of the cover wiring structure.

9. The semiconductor package of claim 1, wherein, in the cover wiring structure, the first slot and the second slot are arranged to be symmetrical with respect to a center line extending in the second horizontal direction.

10. The semiconductor package of claim 1, wherein each of the first slot and the second slot extends in the second horizontal direction from the first side surface toward the second side surface and has an increasing horizontal width.

11. A semiconductor package comprising:
a support wiring structure;
a semiconductor chip on the support wiring structure;
a cover wiring structure on the semiconductor chip;
a filling member filling a space between the support wiring structure and the cover wiring structure; and
a plurality of connection structures passing through the filling member to electrically connect the support wiring structure to the cover wiring structure, wherein
the cover wiring structure includes a cavity which extends from a lower surface of the cover wiring structure to inside of the cover wiring structure and in which an upper portion of the semiconductor chip is positioned, and a first slot and a second slot respectively having a first width and a second width in a first horizontal direction, communicating with the cavity, respectively extending to a first side surface and a second side surface of the cover wiring structure, the first side surface and the second side surface are opposite to each other in a second horizontal direction which is orthogonal to the first horizontal direction of the cover wiring structure, and the first slot and the second slot are spaced apart from the plurality of connection structures in a vertical direction, wherein the filling member fills the cavity, the first slot, and the second slot, wherein the cover wiring structure includes a base insulating layer, an upper surface solder resist layer covering an upper surface of the base insulating layer, and a lower surface solder resist layer covering a lower surface of the base insulating layer, and each of the cavity, the first slot, and the second slot extends from a lower surface of the lower surface solder resist layer into the lower surface solder resist layer.

12. The semiconductor package of claim 11, wherein a depth of the cavity from a lowermost surface of the lower surface solder resist layer is equal to a depth of each of the first slot and the second slot.

13. The semiconductor package of claim 11, wherein a depth of each of the first slot and the second slot from a lowermost surface of the lower surface solder resist layer is greater than a depth of the cavity.

14. The semiconductor package of claim 11, wherein the first slot includes a plurality of first slots and the second slot includes a plurality of second slots and a number of the plurality of first slots of the cover wiring structure is equal to a number of the plurality of second slots of the cover wiring structure, the plurality of first slots and the plurality of second slots are aligned with each other in the second horizontal direction, and the first width and the second width are equal to each other.

15. The semiconductor package of claim 11, wherein each of the support wiring structure and the cover wiring structure comprises a multi-layer printed circuit board.

16. The semiconductor package of claim 15, wherein a thickness of the cover wiring structure is less than a thickness of the support wiring structure.

17. A semiconductor package comprising:
a support wiring structure;
a semiconductor chip on the support wiring structure;
a cover wiring structure on the semiconductor chip and including a multi-layer printed circuit board;
a filling member filling a space between the support wiring structure and the cover wiring structure; and
a plurality of connection structures passing through the filling member to electrically connect the support wiring structure to the cover wiring structure, the plurality of connection structures being separated from the semiconductor chip and disposed around the semiconductor chip, wherein the cover wiring structure includes a cavity which extends from a lower surface of the cover wiring structure into the cover wiring structure and in which an upper portion of the semiconductor chip is positioned, the covering wiring structure includes a first slot and a second slot respectively having a first width and a second width equal to each other in a first horizontal direction, the first slot and the second slot communicating with the cavity and respectively extending to a first side surface and a second side surface of the cover wiring structure, the first side surface and the second side surface are opposite to each other in a second horizontal direction which is orthogonal to the first horizontal direction of the cover wiring structure, and the first slot and the second slot are spaced apart from the plurality of connection structures in a vertical direction, and the plurality of connection structures include a plurality of first connection structures configured to transmit a data signal or a control signal and disposed along a third side surface and a fourth side surface of the cover wiring structure, the third side surface and the fourth side surface are opposite to each other in the first horizontal direction, and a plurality of second connection structures configured to transmit power or ground and disposed along the first side surface and the second side surface of the cover wiring structure and adjacent to the first slot and the second slot, and the filling member fills the cavity, the first slot, and the second slot.

18. The semiconductor package of claim 17, wherein, in the cover wiring structure, the first slot and the second slot are arranged to be symmetrical with respect to a center line extending in the second horizontal direction, and a depth of the cavity from a lowermost surface of the cover wiring structure is equal to a depth of each of the first slot and the second slot.

19. The semiconductor package of claim 17, wherein each of the cavity, the first slot, and the second slot has a depth in a range from about 25 µm to about 60 µm, and each of the first width and the second width is in a range from about 300 µm to about 800 µm.

* * * * *